(12) United States Patent
James et al.

(10) Patent No.: US 6,690,309 B1
(45) Date of Patent: Feb. 10, 2004

(54) HIGH SPEED TRANSMISSION SYSTEM WITH CLOCK INCLUSIVE BALANCED CODING

(75) Inventors: David Vernon James, Palo Alto, CA (US); Hans Wiggors, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 9 days.

(21) Appl. No.: 10/024,609

(22) Filed: Dec. 17, 2001

(51) Int. Cl.[7] .................................................. H03M 7/20
(52) U.S. Cl. ........................................ 341/102; 341/50
(58) Field of Search ........................... 341/102, 50, 51; 375/293, 158, 242, 286; 370/537

(56) References Cited

U.S. PATENT DOCUMENTS

| 4,282,601 | A | 8/1981 | Flora ............................ 375/293 |
| 4,797,951 | A | 1/1989 | Duxbury et al. ............. 359/158 |
| 4,811,361 | A | 3/1989 | Bacou et al. ................. 375/242 |
| H000967 | H | 9/1991 | Mariotti ....................... 370/537 |
| 5,303,265 | A | 4/1994 | McLean ....................... 375/286 |

*Primary Examiner*—Jean Bruner Jeanglaude
(74) *Attorney, Agent, or Firm*—Bradley T. Sako

(57) ABSTRACT

A data transmission system (100) may include a transmitting portion (102) and a receiving portion (104). A transmitting portion (102) may include an encoder (106) that may encode data values of n bits into codes of m bits, where n is less than m. Codes may be transmitted with corresponding clock values. The absolute value of the DC component of a code summed with a corresponding clock value can be no more tan one for all code values.

36 Claims, 16 Drawing Sheets

| input | strobe==0 | strobe==1 |
|---|---|---|
| 0-127 | ~Code0(data) | Code0(data) |
| 128-255 | ~Code1(data) | Code1(data) |
| 256-299 | ~Code2(data) | Code2(data) |

FIG. 8

Code0 data coding

| data | code | data | code | data | code | data | code |
|---|---|---|---|---|---|---|---|
| 00000000 | 00101-1-00011 | 00100000 | 00110-1-10011 | 01000000 | 01001-1-10101 | 01100000 | 01011-1-10001 |
| 00000001 | 00101-1-00101 | 00100001 | 00110-1-10100 | 01000001 | 01001-1-10110 | 01100001 | 01011-1-10010 |
| 00000010 | 00101-1-00110 | 00100010 | 00110-1-10101 | 01000010 | 01001-1-11000 | 01100010 | 01011-1-10100 |
| 00000011 | 00101-1-00111 | 00100011 | 00110-1-10110 | 01000011 | 01001-1-11001 | 01100011 | 01011-1-11000 |
| 00000100 | 00101-1-01001 | 00100100 | 00110-1-11000 | 01000100 | 01001-1-11010 | 01100100 | 01100-1-00011 |
| 00000101 | 00101-1-01010 | 00100101 | 00110-1-11001 | 01000101 | 01001-1-11100 | 01100101 | 01100-1-00101 |
| 00000110 | 00101-1-01011 | 00100110 | 00110-1-11010 | 01000110 | 01010-1-00011 | 01100110 | 01100-1-00110 |
| 00000111 | 00101-1-01100 | 00100111 | 00110-1-11100 | 01000111 | 01010-1-00101 | 01100111 | 01100-1-00111 |
| 00001000 | 00101-1-01101 | 00101000 | 00111-1-00011 | 01001000 | 01010-1-00110 | 01101000 | 01100-1-01001 |
| 00001001 | 00101-1-01110 | 00101001 | 00111-1-00101 | 01001001 | 01010-1-00111 | 01101001 | 01100-1-01010 |
| 00001010 | 00101-1-10001 | 00101010 | 00111-1-00110 | 01001010 | 01010-1-01001 | 01101010 | 01100-1-01011 |
| 00001011 | 00101-1-10010 | 00101011 | 00111-1-01001 | 01001011 | 01010-1-01010 | 01101011 | 01100-1-01100 |
| 00001100 | 00101-1-10011 | 00101100 | 00111-1-01010 | 01001100 | 01010-1-01011 | 01101100 | 01100-1-01101 |
| 00001101 | 00101-1-10100 | 00101101 | 00111-1-01011 | 01001101 | 01010-1-01100 | 01101101 | 01100-1-01110 |
| 00001110 | 00101-1-10101 | 00101110 | 00111-1-10001 | 01001110 | 01010-1-01101 | 01101110 | 01100-1-10001 |
| 00001111 | 00101-1-10110 | 00101111 | 00111-1-10010 | 01001111 | 01010-1-01110 | 01101111 | 01100-1-10010 |
| 00010000 | 00101-1-11000 | 00110000 | 00111-1-10100 | 01010000 | 01010-1-10001 | 01110000 | 01100-1-10011 |
| 00010001 | 00101-1-11001 | 00110001 | 00111-1-11000 | 01010001 | 01010-1-10010 | 01110001 | 01100-1-10100 |
| 00010010 | 00101-1-11010 | 00110010 | 01001-1-00011 | 01010010 | 01010-1-10011 | 01110010 | 01100-1-10101 |
| 00010011 | 00101-1-11100 | 00110011 | 01001-1-00101 | 01010011 | 01010-1-10100 | 01110011 | 01100-1-10110 |
| 00010100 | 00110-1-00011 | 00110100 | 01001-1-00110 | 01010100 | 01010-1-10101 | 01110100 | 01100-1-11000 |
| 00010101 | 00110-1-00101 | 00110101 | 01001-1-00111 | 01010101 | 01010-1-10110 | 01110101 | 01100-1-11001 |
| 00010110 | 00110-1-00110 | 00110110 | 01001-1-01001 | 01010110 | 01010-1-11000 | 01110110 | 01100-1-11010 |
| 00010111 | 00110-1-00111 | 00110111 | 01001-1-01010 | 01010111 | 01010-1-11001 | 01110111 | 01100-1-11100 |
| 00011000 | 00110-1-01001 | 00111000 | 01001-1-01011 | 01011000 | 01010-1-11010 | 01111000 | 01101-1-00011 |
| 00011001 | 00110-1-01010 | 00111001 | 01001-1-01100 | 01011001 | 01010-1-11100 | 01111001 | 01101-1-00101 |
| 00011010 | 00110-1-01011 | 00111010 | 01001-1-01101 | 01011010 | 01011-1-00011 | 01111010 | 01101-1-00110 |
| 00011011 | 00110-1-01100 | 00111011 | 01001-1-01110 | 01011011 | 01011-1-00101 | 01111011 | 01101-1-01001 |
| 00001100 | 00110-1-01101 | 00111100 | 01001-1-10001 | 01001100 | 01011-1-00110 | 01101100 | 01101-1-01010 |
| 00011101 | 00110-1-01110 | 00111101 | 01001-1-10010 | 01011101 | 01011-1-01001 | 01111101 | 01101-1-01100 |
| 00011110 | 00110-1-10001 | 00111110 | 01001-1-10011 | 01011110 | 01011-1-01010 | 01111110 | 01101-1-10001 |
| 00011111 | 00110-1-10010 | 00111111 | 01001-1-10100 | 01011111 | 01011-1-01100 | 01111111 | 01101-1-10010 |

FIG. 9A

Code1 data coding

| data | code | data | code | data | code | data | code |
|---|---|---|---|---|---|---|---|
| 10000000 | 01101-1-10100 | 10100000 | 10010-1-00011 | 11000000 | 10100-1-00110 | 11100000 | 10110-1-01010 |
| 10000001 | 01101-1-11000 | 10100001 | 10010-1-00101 | 11000001 | 10100-1-00111 | 11100001 | 10110-1-01100 |
| 10000010 | 01110-1-00011 | 10100010 | 10010-1-00110 | 11000010 | 10100-1-01001 | 11100010 | 10110-1-10001 |
| 10000011 | 01110-1-00101 | 10100011 | 10010-1-00111 | 11000011 | 10100-1-01010 | 11100011 | 10110-1-10010 |
| 10000100 | 01110-1-00110 | 10100100 | 10010-1-01001 | 11000100 | 10100-1-01011 | 11100100 | 10110-1-10100 |
| 10000101 | 01110-1-01001 | 10100101 | 10010-1-01010 | 11000101 | 10100-1-01100 | 11100101 | 10110-1-11000 |
| 10000110 | 01110-1-01010 | 10100110 | 10010-1-01011 | 11000110 | 10100-1-01101 | 11100110 | 11000-1-00011 |
| 10000111 | 01110-1-01100 | 10100111 | 10010-1-01100 | 11000111 | 10100-1-01110 | 11100111 | 11000-1-00101 |
| 10001000 | 01110-1-10001 | 10101000 | 10010-1-01101 | 11001000 | 10100-1-10001 | 11101000 | 11000-1-00110 |
| 10001001 | 01110-1-10010 | 10101001 | 10010-1-01110 | 11001001 | 10100-1-10010 | 11101001 | 11000-1-00111 |
| 10001010 | 01110-1-10100 | 10101010 | 10010-1-10001 | 11001010 | 10100-1-10011 | 11101010 | 11000-1-01001 |
| 10001011 | 01110-1-11000 | 10101011 | 10010-1-10010 | 11001011 | 10100-1-10100 | 11101011 | 11000-1-01010 |
| 10001100 | 10001-1-00011 | 10101100 | 10010-1-10011 | 11001100 | 10100-1-10101 | 11101100 | 11000-1-01011 |
| 10001101 | 10001-1-00101 | 10101101 | 10010-1-10100 | 11001101 | 10100-1-10110 | 11101101 | 11000-1-01100 |
| 10001110 | 10001-1-00110 | 10101110 | 10010-1-10101 | 11001110 | 10100-1-11000 | 11101110 | 11000-1-01101 |
| 10001111 | 10001-1-00111 | 10101111 | 10010-1-10110 | 11001111 | 10100-1-11001 | 11101111 | 11000-1-01110 |
| 10010000 | 10001-1-01001 | 10110000 | 10010-1-11000 | 11010000 | 10100-1-11010 | 11110000 | 11000-1-10001 |
| 10010001 | 10001-1-01010 | 10110001 | 10010-1-11001 | 11010001 | 10100-1-11100 | 11110001 | 11000-1-10010 |
| 10010010 | 10001-1-01011 | 10110010 | 10010-1-11010 | 11010010 | 10101-1-00011 | 11110010 | 11000-1-10011 |
| 10010011 | 10001-1-01100 | 10110011 | 10010-1-11100 | 11010011 | 10101-1-00101 | 11110011 | 11000-1-10100 |
| 10010100 | 10001-1-01101 | 10110100 | 10011-1-00011 | 11010100 | 10101-1-00110 | 11110100 | 11000-1-10101 |
| 10010101 | 10001-1-01110 | 10110101 | 10011-1-00101 | 11010101 | 10101-1-01001 | 11110101 | 11000-1-10110 |
| 10010110 | 10001-1-10001 | 10110110 | 10011-1-00110 | 11010110 | 10101-1-01010 | 11110110 | 11000-1-11000 |
| 10010111 | 10001-1-10010 | 10110111 | 10011-1-01001 | 11010111 | 10101-1-01100 | 11110111 | 11000-1-11001 |
| 10011000 | 10001-1-10011 | 10111000 | 10011-1-01010 | 11011000 | 10101-1-10001 | 11111000 | 11000-1-11010 |
| 10011001 | 10001-1-10100 | 10111001 | 10011-1-01100 | 11011001 | 10101-1-10010 | 11111001 | 11000-1-11100 |
| 10011010 | 10001-1-10101 | 10111010 | 10011-1-10001 | 11011010 | 10101-1-10100 | 11111010 | 11001-1-00011 |
| 10011011 | 10001-1-10110 | 10111011 | 10011-1-10010 | 11011011 | 10101-1-11000 | 11111011 | 11001-1-00101 |
| 10001100 | 10001-1-11000 | 10111100 | 10011-1-10100 | 11001100 | 10110-1-00011 | 11101100 | 11001-1-00110 |
| 10011101 | 10001-1-11001 | 10111101 | 10011-1-11000 | 11011101 | 10110-1-00101 | 11111101 | 11001-1-01001 |
| 10011110 | 10001-1-11010 | 10111110 | 10100-1-00011 | 11011110 | 10110-1-00110 | 11111110 | 11001-1-01010 |
| 10011111 | 10001-1-11100 | 10111111 | 10100-1-00101 | 11011111 | 10110-1-01001 | 11111111 | 11001-1-01100 |

FIG. 9B

Code2 control coding

| control | code | control | code | control | code |
|---|---|---|---|---|---|
| 100000000 | 11001-1-10001 | 100010000 | 00011-1-00110 | 100100000 | 00011-1-11010 |
| 100000001 | 11001-1-10010 | 100010001 | 00011-1-00111 | 100100001 | 00011-1-11100 |
| 100000010 | 11001-1-10100 | 100010010 | 00011-1-01001 | 100100010 | 11100-1-00011 |
| 100000011 | 11001-1-11000 | 100010011 | 00011-1-01010 | 100100011 | 11100-1-00101 |
| 100000100 | 11010-1-00011 | 100010100 | 00011-1-01011 | 100100100 | 11100-1-00110 |
| 100000101 | 11010-1-00101 | 100010101 | 00011-1-01100 | 100100101 | 11100-1-01001 |
| 100000110 | 11010-1-00110 | 100010110 | 00011-1-01101 | 100100110 | 11100-1-01010 |
| 100000111 | 11010-1-01001 | 100010111 | 00011-1-01110 | 100100111 | 11100-1-01100 |
| 100001000 | 11010-1-01010 | 100011000 | 00011-1-10001 | 100101000 | 11100-1-10001 |
| 100001001 | 11010-1-01100 | 100011001 | 00011-1-10010 | 100101001 | 11100-1-10010 |
| 100001010 | 11010-1-10001 | 100011010 | 00011-1-10011 | 100101010 | 11100-1-10100 |
| 100001011 | 11010-1-10010 | 100011011 | 00011-1-10100 | 100101011 | 11100-1-11000 |
| 100001100 | 11010-1-10100 | 100011100 | 00011-1-10101 | | |
| 100001101 | 11010-1-11000 | 100011101 | 00011-1-10110 | | |
| 100001110 | 00011-1-00011 | 100011110 | 00011-1-11000 | | |
| 100001111 | 00011-1-00101 | 100011111 | 00011-1-11001 | | |

FIG. 9C

Stress6Bias3 coding

| data | code | data | code | data | code | data | code |
|---|---|---|---|---|---|---|---|
| 00000000 | 00001-1-01111 | 00010000 | 01000-1-10111 | 00100000 | 11011-1-00010 | 00110000 | 11101-1-10000 |
| 00000001 | 00001-1-10111 | 00010001 | 01000-1-11011 | 00100001 | 11101-1-00010 | 00110001 | 11110-1-10000 |
| 00000010 | 00001-1-11011 | 00010010 | 01000-1-11101 | 00100010 | 11110-1-00010 | | |
| 00000011 | 00001-1-11101 | 00010011 | 01000-1-11110 | 00100011 | 01111-1-00100 | | |
| 00000100 | 00001-1-11110 | 00010100 | 10000-1-01111 | 00100100 | 10111-1-00100 | | |
| 00000101 | 00010-1-01111 | 00010101 | 10000-1-10111 | 00100101 | 11011-1-00100 | | |
| 00000110 | 00010-1-10111 | 00010110 | 10000-1-11011 | 00100110 | 11101-1-00100 | | |
| 00000111 | 00010-1-11011 | 00010111 | 10000-1-11101 | 00100111 | 11110-1-00100 | | |
| 00001000 | 00010-1-11101 | 00011000 | 10000-1-11110 | 00101000 | 01111-1-01000 | | |
| 00001001 | 00010-1-11110 | 00011001 | 01111-1-00001 | 00101001 | 10111-1-01000 | | |
| 00001010 | 00100-1-01111 | 00011010 | 10111-1-00001 | 00101010 | 11011-1-01000 | | |
| 00001011 | 00100-1-10111 | 00011011 | 11011-1-00001 | 00101011 | 11101-1-01000 | | |
| 00001100 | 00100-1-11011 | 00011100 | 11101-1-00001 | 00101100 | 11110-1-01000 | | |
| 00001101 | 00100-1-11101 | 00011101 | 11110-1-00001 | 00101101 | 01111-1-10000 | | |
| 00001110 | 00100-1-11110 | 00011110 | 01111-1-00010 | 00101110 | 10111-1-10000 | | |
| 00001111 | 01000-1-01111 | 00011111 | 10111-1-00010 | 00101111 | 11011-1-10000 | | |

FIG. 10A

Stress6Bias5 coding

| data | code | data | code |
|---|---|---|---|
| 00000000 | 00000-1-11111 | 00000001 | 11111-1-00000 |

FIG. 10B

Stress5Bias0 coding

| data | code | data | code | data | code | data | code |
|---|---|---|---|---|---|---|---|
| 00000000 | 00011-1-00011 | 00100000 | 01001-1-00110 | 01000000 | 10001-1-01010 | 01100000 | 11000-1-10001 |
| 00000001 | 00011-1-00101 | 00100001 | 01001-1-01001 | 01000001 | 10001-1-01100 | 01100001 | 11000-1-10010 |
| 00000010 | 00011-1-00110 | 00100010 | 01001-1-01010 | 01000010 | 10001-1-10001 | 01100010 | 11000-1-10100 |
| 00000011 | 00011-1-01001 | 00100011 | 01001-1-01100 | 01000011 | 10001-1-10010 | 01100011 | 11000-1-11000 |
| 00000100 | 00011-1-01010 | 00100100 | 01001-1-10001 | 01000100 | 10001-1-10100 | | |
| 00000101 | 00011-1-01100 | 00100101 | 01001-1-10010 | 01000101 | 10001-1-11000 | | |
| 00000110 | 00011-1-10001 | 00100110 | 01001-1-10100 | 01000110 | 10010-1-00011 | | |
| 00000111 | 00011-1-10010 | 00100111 | 01001-1-11000 | 01000000 | 10001-1-01010 | | |
| 00001000 | 00011-1-10100 | 00101000 | 01010-1-00011 | 01001000 | 10010-1-00110 | | |
| 00001001 | 00011-1-11000 | 00101001 | 01010-1-00101 | 01001001 | 10010-1-01001 | | |
| 00001010 | 00101-1-00011 | 00101010 | 01010-1-00110 | 01001010 | 10010-1-01010 | | |
| 00001011 | 00101-1-00101 | 00101011 | 01010-1-01001 | 01001011 | 10010-1-01100 | | |
| 00001100 | 00101-1-00110 | 00101100 | 01010-1-01010 | 01001100 | 10010-1-10001 | | |
| 00001101 | 00101-1-01001 | 00101101 | 01010-1-01100 | 01001101 | 10010-1-10010 | | |
| 00001110 | 00101-1-01010 | 00101110 | 01010-1-10001 | 01001110 | 10010-1-10100 | | |
| 00001111 | 00101-1-01100 | 00101111 | 01010-1-10010 | 01001111 | 10010-1-11000 | | |
| 00010000 | 00101-1-10001 | 00110000 | 01010-1-10100 | 01010000 | 10100-1-00011 | | |
| 00010001 | 00101-1-10010 | 00110001 | 01010-1-11000 | 01010001 | 10100-1-00101 | | |
| 00010010 | 00101-1-10100 | 00110010 | 01100-1-00011 | 01010010 | 10100-1-00110 | | |
| 00010011 | 00101-1-11000 | 00110011 | 01100-1-00101 | 01010011 | 10100-1-01001 | | |
| 00010100 | 00110-1-00011 | 00110100 | 01100-1-00110 | 01010100 | 10100-1-01010 | | |
| 00010101 | 00110-1-00101 | 00110101 | 01100-1-01001 | 01010101 | 10100-1-01100 | | |
| 00010110 | 00110-1-00110 | 00110110 | 01100-1-01010 | 01010110 | 10100-1-10001 | | |
| 00010111 | 00110-1-01001 | 00110111 | 01100-1-01100 | 01010111 | 10100-1-10010 | | |
| 00011000 | 00110-1-01010 | 00111000 | 01100-1-10001 | 01011000 | 10100-1-10100 | | |
| 00011001 | 00110-1-01100 | 00111001 | 01100-1-10010 | 01011001 | 10100-1-11000 | | |
| 00011010 | 00110-1-10001 | 00111010 | 01100-1-10100 | 01011010 | 11000-1-00011 | | |
| 00011011 | 00110-1-10010 | 00111011 | 01100-1-11000 | 01011011 | 11000-1-00101 | | |
| 00001100 | 00110-1-10100 | 00111100 | 10001-1-00011 | 01001100 | 11000-1-00110 | | |
| 00011101 | 00110-1-11000 | 00111101 | 10001-1-00101 | 01011101 | 11000-1-01001 | | |
| 00011110 | 01001-1-00011 | 00111110 | 10001-1-00110 | 01011110 | 11000-1-01010 | | |
| 00011111 | 01001-1-00101 | 00111111 | 10001-1-01001 | 01011111 | 11000-1-01100 | | |

FIG. 10C

Stress5Bias2 coding

| data | code | data | code | data | code | data | code |
|---|---|---|---|---|---|---|---|
| 00000000 | 00001-1-00111 | 00100000 | 01000-1-01101 | 01000000 | 10011-1-00010 | 01100000 | 10110-1-10000 |
| 00000001 | 00001-1-01011 | 00100001 | 01000-1-01110 | 01000001 | 10101-1-00010 | 01100001 | 11001-1-10000 |
| 00000010 | 00001-1-01101 | 00100010 | 01000-1-10011 | 01000010 | 10110-1-00010 | 01100010 | 11010-1-10000 |
| 00000011 | 00001-1-01110 | 00100011 | 01000-1-10101 | 01000011 | 11001-1-00010 | 01100011 | 11100-1-10000 |
| 00000100 | 00001-1-10011 | 00100100 | 01000-1-10110 | 01000100 | 11010-1-00010 | | |
| 00000101 | 00001-1-10101 | 00100101 | 01000-1-11001 | 01000101 | 11100-1-00010 | | |
| 00000110 | 00001-1-10110 | 00100110 | 01000-1-11010 | 01000110 | 00111-1-00100 | | |
| 00000111 | 00001-1-11001 | 00100111 | 01000-1-11100 | 01000111 | 01011-1-00100 | | |
| 00001000 | 00001-1-11010 | 00101000 | 10000-1-00111 | 01001000 | 01101-1-00100 | | |
| 00001001 | 00001-1-11100 | 00101001 | 10000-1-01011 | 01001001 | 01110-1-00100 | | |
| 00001010 | 00010-1-00111 | 00101010 | 10000-1-01101 | 01001010 | 10011-1-00100 | | |
| 00001011 | 00010-1-01011 | 00101011 | 10000-1-01110 | 01001011 | 10101-1-00100 | | |
| 00001100 | 00010-1-01101 | 00101100 | 10000-1-10011 | 01001100 | 10110-1-00100 | | |
| 00001101 | 00010-1-01110 | 00101101 | 10000-1-10101 | 01001101 | 11001-1-00100 | | |
| 00001110 | 00010-1-10011 | 00101110 | 10000-1-10110 | 01001110 | 11010-1-00100 | | |
| 00001111 | 00010-1-10101 | 00101111 | 10000-1-11001 | 01001111 | 11100-1-00100 | | |
| 00010000 | 00010-1-10110 | 00110000 | 10000-1-11010 | 01010000 | 00111-1-01000 | | |
| 00010001 | 00010-1-11001 | 00110001 | 10000-1-11100 | 01010001 | 01011-1-01000 | | |
| 00010010 | 00010-1-11010 | 00110010 | 00111-1-00001 | 01010010 | 01101-1-01000 | | |
| 00010011 | 00010-1-11100 | 00110011 | 01011-1-00001 | 01010011 | 01110-1-01000 | | |
| 00010100 | 00100-1-00111 | 00110100 | 01101-1-00001 | 01010100 | 10011-1-01000 | | |
| 00010101 | 00100-1-01011 | 00110101 | 01110-1-00001 | 01010101 | 10101-1-01000 | | |
| 00010110 | 00100-1-01101 | 00110110 | 10011-1-00001 | 01010110 | 10110-1-01000 | | |
| 00010111 | 00100-1-01110 | 00110111 | 10101-1-00001 | 01010111 | 11001-1-01000 | | |
| 00011000 | 00100-1-10011 | 00111000 | 10110-1-00001 | 01011000 | 11010-1-01000 | | |
| 00011001 | 00100-1-10101 | 00111001 | 11001-1-00001 | 01011001 | 11100-1-01000 | | |
| 00011010 | 00100-1-10110 | 00111010 | 11010-1-00001 | 01011010 | 00111-1-10000 | | |
| 00011011 | 00100-1-11001 | 00111011 | 11100-1-00001 | 01011011 | 01011-1-10000 | | |
| 00001100 | 00100-1-11010 | 00111100 | 00111-1-00010 | 01001100 | 01101-1-10000 | | |
| 00011101 | 00100-1-11100 | 00111101 | 01011-1-00010 | 01011101 | 01110-1-10000 | | |
| 00011110 | 01000-1-00111 | 00111110 | 01101-1-00010 | 01011110 | 10011-1-10000 | | |
| 00011111 | 01000-1-01011 | 00111111 | 01110-1-00010 | 01011111 | 10101-1-10000 | | |

FIG. 10D

Stress5Bias4 coding

| data | code | data | code | data | code |
|---|---|---|---|---|---|
| 00000000 | 00000-1-01111 | 00000100 | 00000-1-11110 | 00001000 | 11101-1-00000 |
| 00000001 | 00000-1-10111 | 00000101 | 01111-1-00000 | 00001001 | 11110-1-00000 |
| 00000010 | 00000-1-11011 | 00000110 | 10111-1-00000 | | |
| 00000011 | 00000-1-11101 | 00000111 | 11011-1-00000 | | |

FIG. 10E

Stress4Bias1 coding

| data | code | data | code | data | code | data | code |
|---|---|---|---|---|---|---|---|
| 00000000 | 00001-1-00011 | 00100000 | 01000-1-01001 | 01000000 | 01010-1-00010 | 01100000 | 10001-1-10000 |
| 00000001 | 00001-1-00101 | 00100001 | 01000-1-01010 | 01000001 | 01100-1-00010 | 01100001 | 10010-1-10000 |
| 00000010 | 00001-1-00110 | 00100010 | 01000-1-01100 | 01000010 | 10001-1-00010 | 01100010 | 10100-1-10000 |
| 00000011 | 00001-1-01001 | 00100011 | 01000-1-10001 | 01000011 | 10010-1-00010 | 01100011 | 11000-1-10000 |
| 00000100 | 00001-1-01010 | 00100100 | 01000-1-10010 | 01000100 | 10100-1-00010 | | |
| 00000101 | 00001-1-01100 | 00100101 | 01000-1-10100 | 01000101 | 11000-1-00010 | | |
| 00000110 | 00001-1-10001 | 00100110 | 01000-1-11000 | 01000110 | 00011-1-00100 | | |
| 00000111 | 00001-1-10010 | 00100111 | 01000-1-01001 | 01000111 | 00101-1-00100 | | |
| 00001000 | 00001-1-10100 | 00101000 | 10000-1-00011 | 01001000 | 00110-1-00100 | | |
| 00001001 | 00001-1-11000 | 00101001 | 10000-1-00101 | 01001001 | 01001-1-00100 | | |
| 00001010 | 00010-1-00011 | 00101010 | 10000-1-00110 | 01001010 | 01010-1-00100 | | |
| 00001011 | 00010-1-00101 | 00101011 | 10000-1-01001 | 01001011 | 01100-1-00100 | | |
| 00001100 | 00010-1-00110 | 00101100 | 10000-1-01010 | 01001100 | 10001-1-00100 | | |
| 00001101 | 00010-1-01001 | 00101101 | 10000-1-01100 | 01001101 | 10010-1-00100 | | |
| 00001110 | 00010-1-01010 | 00101110 | 10000-1-10001 | 01001110 | 10100-1-00100 | | |
| 00001111 | 00010-1-01100 | 00101111 | 10000-1-10010 | 01001111 | 11000-1-00100 | | |
| 00010000 | 00010-1-10001 | 00110000 | 10000-1-10100 | 01010000 | 00011-1-01000 | | |
| 00010001 | 00010-1-10010 | 00110001 | 10000-1-11000 | 01010001 | 00101-1-01000 | | |
| 00010010 | 00010-1-10100 | 00110010 | 00011-1-00001 | 01010010 | 00110-1-01000 | | |
| 00010011 | 00010-1-11000 | 00110011 | 00101-1-00001 | 01010011 | 01001-1-01000 | | |
| 00010100 | 00100-1-00011 | 00110100 | 00110-1-00001 | 01010100 | 01010-1-01000 | | |
| 00010101 | 00100-1-00101 | 00110101 | 01001-1-00001 | 01010101 | 01100-1-01000 | | |
| 00010110 | 00100-1-00110 | 00110110 | 01010-1-00001 | 01010110 | 10001-1-01000 | | |
| 00010111 | 00100-1-01001 | 00110111 | 01100-1-00001 | 01010111 | 10010-1-01000 | | |
| 00011000 | 00100-1-01010 | 00111000 | 10001-1-00001 | 01011000 | 10100-1-01000 | | |
| 00011001 | 00100-1-01100 | 00111001 | 10010-1-00001 | 01011001 | 11000-1-01000 | | |
| 00011010 | 00100-1-10001 | 00111010 | 10100-1-00001 | 01011010 | 00011-1-10000 | | |
| 00011011 | 00100-1-10010 | 00111011 | 11000-1-00001 | 01011011 | 00101-1-10000 | | |
| 00001100 | 00100-1-10100 | 00111100 | 00011-1-00010 | 01001100 | 00110-1-10000 | | |
| 00011101 | 00100-1-11000 | 00111101 | 00101-1-00010 | 01011101 | 01001-1-10000 | | |
| 00011110 | 01000-1-00011 | 00111110 | 00110-1-00010 | 01011110 | 01010-1-10000 | | |
| 00011111 | 01000-1-00101 | 00111111 | 01001-1-00010 | 01011111 | 01100-1-10000 | | |

FIG. 10F

Stress4Bias3 codes

| data | code | data | code | data | code |
|---|---|---|---|---|---|
| 00000000 | 00000-1-00111 | 00001000 | 00000-1-11010 | 00010000 | 10110-1-00000 |
| 00000001 | 00000-1-01011 | 00001001 | 00000-1-11100 | 00010001 | 11001-1-00000 |
| 00000010 | 00000-1-01101 | 00001010 | 00111-1-00000 | 00010010 | 11010-1-00000 |
| 00000011 | 00000-1-01110 | 00001011 | 01011-1-00000 | 00010011 | 11100-1-00000 |
| 00000100 | 00000-1-10011 | 00001100 | 01101-1-00000 | | |
| 00000101 | 00000-1-10101 | 00001101 | 01110-1-00000 | | |
| 00000110 | 00000-1-10110 | 00001110 | 10011-1-00000 | | |
| 00000111 | 00000-1-11001 | 00001111 | 10101-1-00000 | | |

FIG. 10G

Stress3Bias0 codes

| data | code | data | code | data | code | data | code |
|---|---|---|---|---|---|---|---|
| 00000000 | 00001-1-00001 | 00001000 | 00010-1-01000 | 00010000 | 01000-1-00010 | 00011000 | 10000-1-10000 |
| 00000001 | 00001-1-00010 | 00001001 | 00010-1-10000 | 00010001 | 01000-1-00100 | | |
| 00000010 | 00001-1-00100 | 00001010 | 00100-1-00001 | 00010010 | 01000-1-01000 | | |
| 00000011 | 00001-1-01000 | 00001011 | 00100-1-00010 | 00010011 | 01000-1-10000 | | |
| 00000100 | 00001-1-10000 | 00001100 | 00100-1-00100 | 00010100 | 10000-1-00001 | | |
| 00000101 | 00010-1-00001 | 00001101 | 00100-1-01000 | 00010101 | 10000-1-00010 | | |
| 00000110 | 00010-1-00010 | 00001110 | 00100-1-10000 | 00010110 | 10000-1-00100 | | |
| 00000111 | 00010-1-00100 | 00001111 | 01000-1-00001 | 00010111 | 10000-1-01000 | | |

FIG. 10H

Stress3Bias2 codes

| data | code | data | code | data | code |
|---|---|---|---|---|---|
| 00000000 | 00000-1-00011 | 00001000 | 00000-1-10100 | 00010000 | 10001-1-00000 |
| 00000001 | 00000-1-00101 | 00001001 | 00000-1-11000 | 00010001 | 10010-1-00000 |
| 00000010 | 00000-1-00110 | 00001010 | 00011-1-00000 | 00010010 | 10100-1-00000 |
| 00000011 | 00000-1-01001 | 00001011 | 00101-1-00000 | 00010011 | 11000-1-00000 |
| 00000100 | 00000-1-01010 | 00001100 | 00110-1-00000 | | |
| 00000101 | 00000-1-01100 | 00001101 | 01001-1-00000 | | |
| 00000110 | 00000-1-10001 | 00001110 | 01010-1-00000 | | |
| 00000111 | 00000-1-10010 | 00001111 | 01100-1-00000 | | |

FIG. 10I

Stress2Bias1 codes

| data | code | data | code | data | code |
|---|---|---|---|---|---|
| 00000000 | 00000-1-00001 | 00001000 | 00000-1-10000 | 00010000 | 01000-1-00000 |
| 00000001 | 00000-1-00010 | 00001001 | 00001-1-00000 | 00010001 | 10000-1-00000 |
| 00000010 | 00000-1-00100 | 00001010 | 00010-1-00000 | | |
| 00000011 | 00000-1-01000 | 00001011 | 00100-1-00000 | | |

FIG. 10J

Stress1Bias0 codes

| data | code |
|---|---|
| 00000000 | 00000-1-00000 |

FIG. 10K

| test | strobe=0 | strobe=1 |
|---|---|---|
| Sum0_Bias0 | Stress1Bias1^STROBE | — |
| Sum1_Bias0 | — | Stress2Bias1 |
| Sum2_Bias0 | Stress3Bias0^STROBE | — |
| Sum2_Bias1 | — | Stress2Bias1 |
| Sum2_Bias2 | Stress3Bias2^STROBE | — |
| Sum3_Bias0 | — | Stress3Bias0 |
| Sum3_Bias1 | Stress4Bias1^STROBE | — |
| Sum3_Bias2 | — | Stress3Bias2 |
| Sum3_Bias3 | Stress4Bias3^STROBE | — |
| Sum4_Bias0 | Stress5Bias0^STROBE | — |
| Sum4_Bias1 | — | Stress4Bias1 |
| Sum4_Bias2 | Stress5Bias2^STROBE | — |
| Sum4_Bias3 | — | Stress4Bias3 |
| Sum4_Bias4 | Stress5Bias4^STROBE | — |
| Sum5_Bias2 | — | Stress5Bias2 |
| Sum5_Bias3 | Stress6Bias3^STROBE | — |
| Sum5_Bias4 | — | Stress5Bias4 |
| Sum5_Bias5 | Stress6Bias5^STROBE | — |
| Sum6_Bias2 | ~Stress5Bias2 | — |
| Sum6_Bias3 | — | Stress6Bias3 |
| Sum6_Bias4 | ~Stress5Bias4 | — |
| Sum6_Bias5 | — | Stress6Bias5 |
| Sum7_Bias0 | — | ~Stress5Bias0^STROBE |
| Sum7_Bias1 | ~Stress4Bias1 | — |
| Sum7_Bias2 | — | ~Stress5Bias2^STROBE |
| Sum7_Bias3 | ~Stress4Bias3 | — |
| Sum7_Bias4 | — | ~Stress5Bias4^STROBE |
| Sum8_Bias0 | ~Stress3Bias0 | — |
| Sum8_Bias1 | — | ~Stress4Bias1^STROBE |
| Sum8_Bias2 | ~Stress3Bias2 | — |
| Sum8_Bias3 | — | ~Stress4Bias3^STROB |
| Sum9_Bias0 | — | ~Stress3Bias0^STROBE |
| Sum9_Bias1 | ~Stress2Bias1 | — |
| Sum9_Bias2 | — | ~Stress3Bias2^STROB |
| Sum10_Bias0 | ~Stress1Bias0 | — |
| Sum10_Bias1 | — | ~Stress2Bias1^STROBE |
| Sum11_Bias0 | — | ~Stress1Bias0^STROBE |

FIG. 11

| VALUE | NAME | DESCRIPTION |
|---|---|---|
| 11001 11000 | IDLE | LEADING CHARACTER OF IDLE SYMBOLS |
| 00011 00111 | FRAME0 | 1st, 3rd AND 4th CHARACTER OF FRAME SYMBOL |
| 11100 11000 | FRAME1 | 2nd CHARACTER OF FRAME SYMBOL |
FIG. 12A
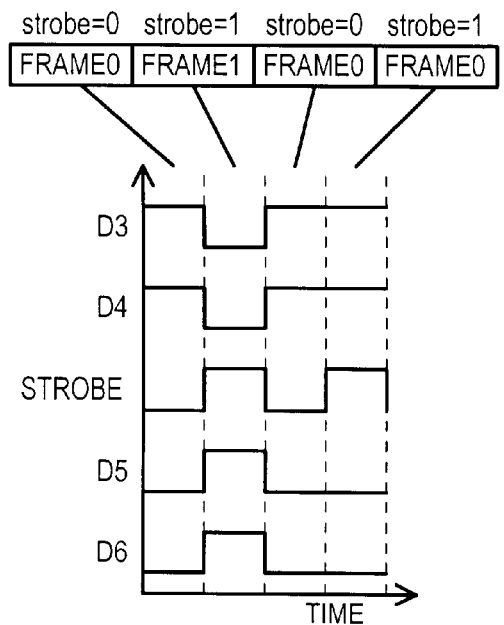
FIG. 12B
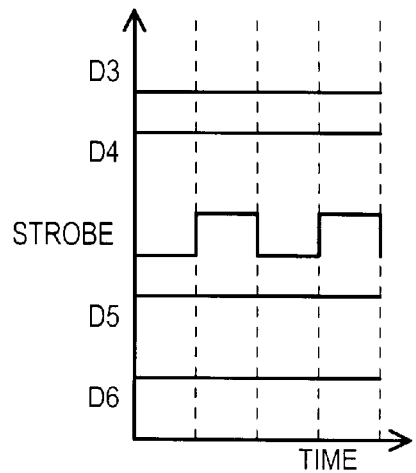
FIG. 12C
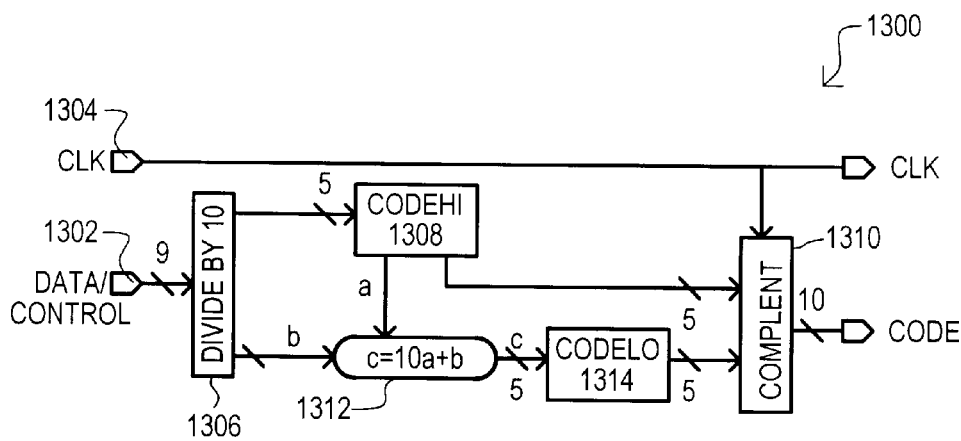
FIG. 13

```
unsigned char encodeHi[30] = {
  S_10|B00101, S_10|B00110, S20A|B00111, S20B|B00111,
  S_10|B01001, S_10|B01010, S20A|B01011, S20B|B01011,
  S_10|B01100, S20A|B01101, S20B|B01101, S20A|B01110,
  S20B|B01110, S_10|B10001, S_10|B10010, S20A|B10011,
  S20B|B10011, S_10|B10100, S20A|B10101, S20B|B10101,
  S20A|B10110, S20B|B10110, S_10|B11000, S20A|B11001,
  S20B|B11001, S20A|B11010, S20B|B11010, S20A|B11100,
  S20B|B11100, S_10|B00011
};

unsigned char encode10[10] = {
  B00111, B01011, B01101, B01110, B10011,
  B10101, B10110, B11001, B11010, B11100
};

unsigned char encode20[20] = {
  B00011, B00101, B00110, B00111, B01001,
  B01010, B01011, B01100, B01101, B01110,
  B10001, B10010, B10011, B10100, B10101,
  B10110, B11000, B11001, B11010, B11100
};

Encoder(int data, int strobe)
{ int code;
  code= Encoding(data);
  return((strobe ? ~code : code)&0X3FF);
}

Encoding(int data)
{ int hiCode, rem, high, lower;
  hiCode= encodeHi[data/10];
  rem= (data%10);
  high= (hiCode&0X1F)<<5;
  switch(hiCode&0XE0) {
  case S_10:
    lower= encode10[rem];
    break;
  case S20A:
    lower= encode20[rem];
    break;
  case S20B:
    lower= encode20[rem+10];
    break;
  default:
    assert(0);
  }
  return(high | lower);
}
```

FIG. 14

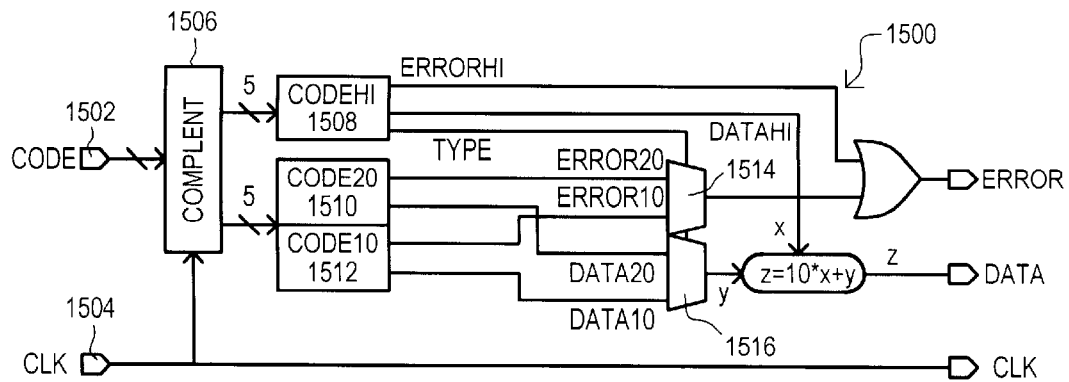
FIG. 15
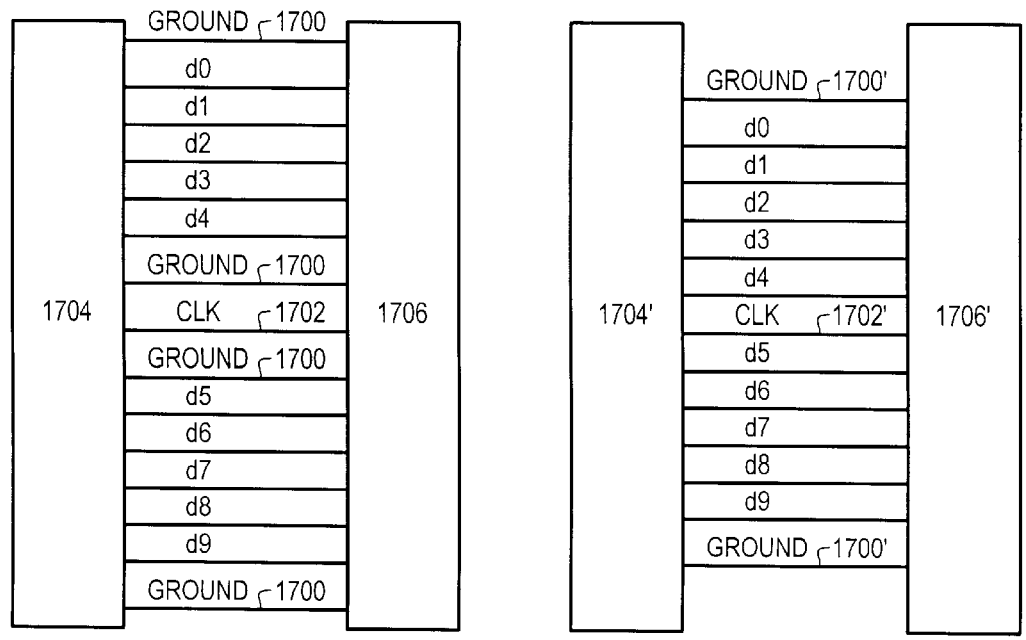
FIG. 17A
FIG. 17B

```
unsigned char decodeHi[32] = {
 ERR_HI /* 00000 */, ERR_HI /* 00001 */, ERR_HI /* 00010 */, S10|29 /* 00011 */,
 ERR_HI /* 00100 */, S10|0  /* 00101 */, S10|1  /* 00110 */, S20|2  /* 00111 */,
 ERR_HI /* 01000 */, S10|4  /* 01001 */, S10|5  /* 01010 */, S20|6  /* 01011 */,
 S10|8  /* 01100 */, S20|9  /* 01101 */, S20|11 /* 01110 */, ERR_HI /* 01111 */,
 ERR_HI /* 10000 */, S10|13 /* 10001 */, S10|14 /* 10010 */, S20|15 /* 10011 */,
 S10|17 /* 10100 */, S20|18 /* 10101 */, S20|20 /* 10110 */, ERR_HI /* 10111 */,
 S10|22 /* 11000 */, S20|23 /* 11001 */, S20|25 /* 11010 */, ERR_HI /* 11011 */,
 S20|27 /* 11100 */, ERR_HI /* 11101 */, ERR_HI /* 11110 */, ERR_HI /* 11111 */
};

unsigned char decode10[32] = {
 ERR /* 00000 */, ERR /* 00001 */, ERR /* 00010 */, ERR /* 00011 */,
 ERR /* 00100 */, ERR /* 00101 */, ERR /* 00110 */, 0   /* 00111 */,
 ERR /* 01000 */, ERR /* 01001 */, 4   /* 01010 */, 1   /* 01011 */,
 ERR /* 01100 */, 2   /* 01101 */, 3   /* 01110 */, ERR /* 01111 */,
 ERR /* 10000 */, ERR /* 10001 */, ERR /* 10010 */, 4   /* 10011 */,
 ERR /* 10100 */, 5   /* 10101 */, 6   /* 10110 */, ERR /* 10111 */,
 ERR /* 11000 */, 7   /* 11001 */, 8   /* 11010 */, ERR /* 11011 */,
 9   /* 11100 */, ERR /* 11101 */, ERR /* 11110 */, ERR /* 11111 */
};

unsigned char decode20[32] = {
 ERR /* 00000 */, ERR /* 00001 */, ERR /* 00010 */, 0   /* 00011 */,
 ERR /* 00100 */, 1   /* 00101 */, 2   /* 00110 */, 3   /* 00111 */,
 ERR /* 01000 */, 4   /* 01001 */, 5   /* 01010 */, 6   /* 01011 */,
 7   /* 01100 */, 8   /* 01101 */, 9   /* 01110 */, ERR /* 01111 */,
 ERR /* 10000 */, 10  /* 10001 */, 11  /* 10010 */, 12  /* 10011 */,
 13  /* 10100 */, 14  /* 10101 */, 15  /* 10110 */, ERR /* 10111 */,
 16  /* 11000 */, 17  /* 11001 */, 18  /* 11010 */, ERR /* 11011 */,
 19  /* 11100 */, ERR /* 11101 */, ERR /* 11110 */, ERR /* 11111 */
};

int
Decoder(int data, int strobe)
{  int decode, hi, lo, hiCode, hiType, hiData,
      loCode, loType, loData, code, error;

decode= (strobe==0) ? data : data^0X3FF;
   hi= (decode>>5)&0X1F;
   lo= decode&0X1F;
   hiCode= decodeHi[hi];
   hiType= (hiCode)&0XE0;
   hiData= hiCode&0X1F;
   loCode= hiType==S20 ? decode20[lo] : decode10[lo];
   loType= loCode&0XE0;
   loData= loCode&0X1F;
   code= 10*hiData+loData;
   error= (hiType==ERR || loType==ERR);
   return(error ? -1 : code);
}
```

FIG. 16

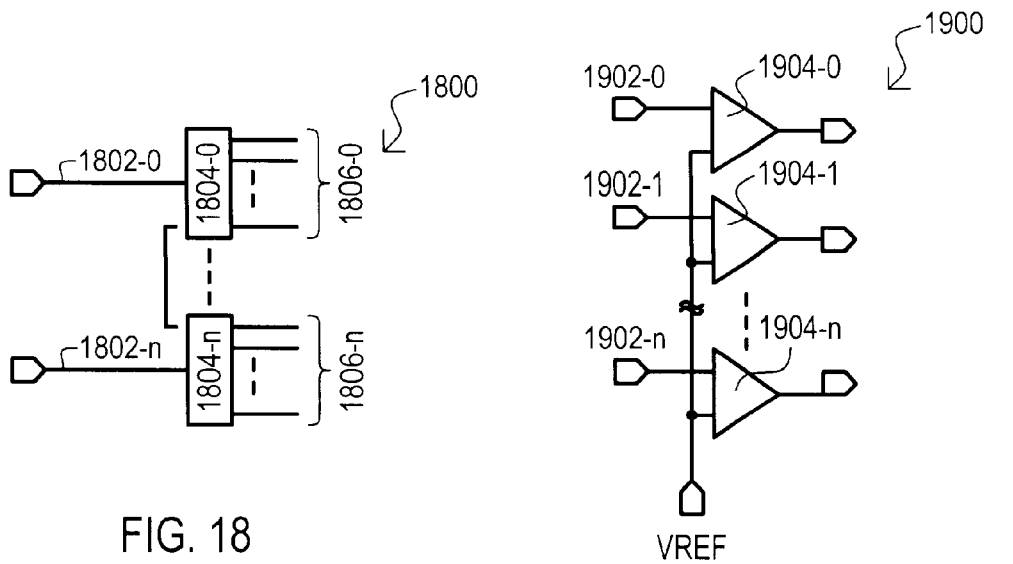
FIG. 18
BACKGROUND ART
FIG. 19
BACKGROUND ART
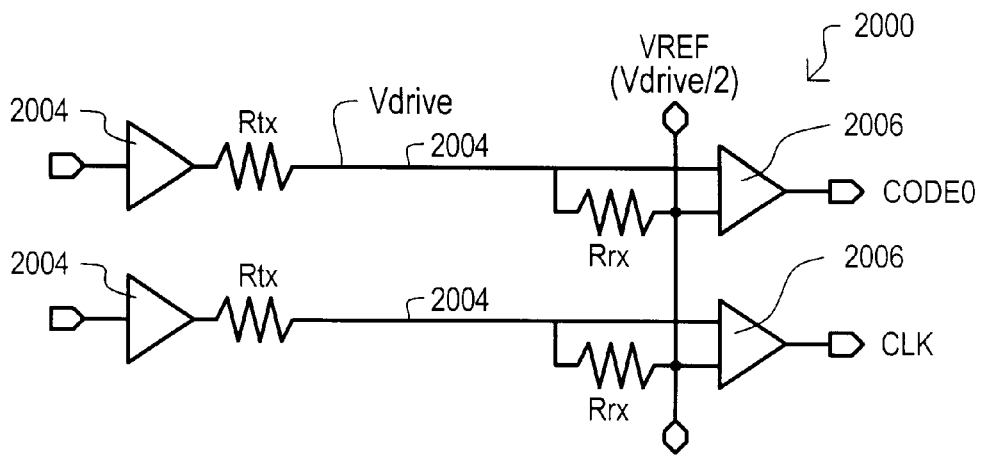
FIG. 20
BACKGROUND ART

HIGH SPEED TRANSMISSION SYSTEM WITH CLOCK INCLUSIVE BALANCED CODING

TECHNICAL FIELD

The present invention relates generally to data transmission systems, and more particularly to high speed data transmission systems in which data values may be transmitted with a clock signal.

BACKGROUND OF THE INVENTION

The increasing need for faster data communication rates has led to corresponding needs for faster transmission of data between system components. Networking hardware is but one of the numerous applications in which such increased speed is needed. Within a high-speed router data is typically transmitted between one or more integrated circuits. If such inter-chip data transmission speeds can be increased (e.g., in the range of 1 gigabits/second per pin), the overall speed/bandwidth of the connection between integrated circuits may also be increased.

Data transmission systems can include bus connections, in which bus lines may be commonly shared between multiple devices, and point-to-point connections, in which a one device is connected to another by one or more direct data transmission lines. Bus oriented systems may have a number of drawbacks. Due to the number of devices attached to the bus lines (because they are shared among multiple devices) the inherent capacitance attached to the lines may be large, limiting the speed at which the lines may be driven. Larger lines may consume higher amounts of power, as well. Still further, because a bus is commonly shared, some form of arbitration is typically included to enable one device to have control of the bus at a given time. Such arbitration needs can add to the complexity of the system. It is also noted that the inclusion of a common bus on a circuit board, or the like, requires a dedicated amount of area. This can work against the goal of manufacturing systems that are as physically compact as possible.

Bus and point-to-point approaches may have common drawbacks. One such drawback is susceptibility to "ground bounce." Ground bounce may occur due to sudden current draws on a power supply. In arrangements where signal lines are situated over a ground plane, rapid fluctuations in current may result in noise radiating from such a ground plane. In addition, or alternatively, due to inherent inductance in a power supply, a rapid fluctuation in current can cause a ground or supply voltage to vary (i.e., bounce). This may adversely affect data sensing operations that may depend on a stable supply voltage, or reference voltages generated from such supply voltages.

Yet another common drawback can arise in cases where a system includes differential type receiver circuits that rely on a reference voltage to distinguish between logic values. Circuits for generating such reference voltages can be complex. "Band-gap" reference voltage generators, and the like, represent but one example of a more complex reference voltage generating circuit. In many cases, reference voltage generating circuits must be designed to account for temperature, process and other variations. In addition, in many cases such circuits can be dependent upon a particular supply voltage (i.e., are not supply voltage independent).

Typically, transmission systems can rely on some sort of clock (or strobe) signal to extract information from a data signal. Clock signals may be supplied separately, or may be encoded within a data signal. A drawback to encoded data signals can be ancillary circuitry that may be necessary. As but one example, in many cases a phase lock loop (PLL) may have to be included to recover an embedded clock, and thereby enable data to be extracted. Still further, a data stream for a signal with an embedded clock may require a certain number of transitions within a given time period.

Various conventional examples will now be described with reference to a number of figures. Referring now to FIG. 18, a conventional data transmission system, that includes a serial to parallel conversion step, is shown in a block diagram and designated by the general reference character 1800. A system 1800 may receive one or more input lines 1802-0 to 1802-n on which data may be transmitted in serial form. Such serial data may include an embedded clock. Serial data may be stored in corresponding storage circuits 1804-0 to 1804-n, or like. Once a predetermined number of bits have been accumulated, such bits may be transmitted, in parallel from such storage circuits (1804-0 to 1804-n) onto parallel output lines 1806-0 to 1806-n. In addition to the various drawbacks described above, a conventional system 1800 also introduces the undesirable delay involved in converting serial data to parallel form. More particularly, a conversion to 8 parallel bits can require an 8 cycle latency.

Another conventional approach is shown in FIG. 19. FIG. 19 shows a conventional system 1900 in which data may be transmitted in parallel along input lines 1902-0 to 1902-n. Each input line (1902-0 to 1902-n) may be received at the input of a corresponding differential amplifier (1904-0 to 1904-n). Differential amplifiers (1904-0 to 1904-n) may distinguish between logic levels by amplifying differences between a reference voltage and an input line potential. A drawback to a parallel approach, such as that shown in FIG. 19, can be susceptibility to noise effects due to ground bounce, or the like. More particularly, a large majority of data signals may have the same logic level, generating a fluctuation in current and the corresponding adverse consequences noted above.

Additional drawbacks to a conventional case such as that shown in FIG. 19 can be the difficulty in generating a robust reference voltage.

Referring now to FIG. 20, a block diagram of a third conventional 2000 case is shown. A system according to a third embodiment may include a transmitting driver 2002 that can drive an input line 2004 between a voltage Vdrive and ground. An input line 2004 may be provided to one input of a receiving differential amplifier 2006. A second input to differential amplifier 2006 can be a reference voltage Vref, which may be ideally Vdrive/2. Termination resistance Rtx and Rrx may also be included to meet predetermined line impedance values for minimizing adverse transmission line effects.

The example of FIG. 20 may include some of the same drawbacks as that of FIG. 19. In particular, having unbalanced data values may generate noise, and the generation of a reference voltage may be complicated and/or not necessarily supply independent.

In light of the above, it would desirable to arrive at a data transmission system that may transmit data between two points without incurring the drawbacks of ground bounce noise and/or similar adverse effects. It would also be desirable to arrive at a system that is not subject to the constraints of conventional systems that may employ a separately generated reference voltage.

It would also be desirable to arrive at a data transmission system that may meet other additional capabilities.

An important system capability can be the ability to test a system or component for certain parameters. That is, while various system components may include particular operating specifications, once such components are assembled it can be difficult to test the operation of such systems. In a data transmission system, it can be valuable to determine how a system or component may operate under adverse condition that can result in additional noise and/or variations in a reference voltage. However, it can be difficult to introduce such conditions in order to actually test a system or component.

In systems that can operate according to a clock signal, an important feature can be the ability to determine signal skew. Signal skew, as related to data transmission systems, can include differences between a data value transition and an ideal transition, such as that of a clock signal. Determining signal skew of a system may allow for a system to be adjusted for better performance, and allow for a better understanding of the operational limitations of a system.

Thus, in light of the above discussion, it would be desirable to arrive at a data system that may allow for easier testing and/or provide a better way of measuring signal skew.

In many conventional approaches, data may be encoded prior to transmission and decoded upon reception. Encoding can improve the reliability of a data transmission by enabling easier clock recovery and/or reducing a "DC component" of a transmission. In the case of binary transmissions, a DC component can be derived by adding for every "1" and subtracting for every "0". Thus, as is well understood, the binary word 0000 1111 has a DC component of zero, while the binary word 1111 1111 has a DC component of eight. In serial communications, high DC components can lead to signal "wandering" and thus erroneous transmissions. In parallel communications, high DC components can contribute to ground bounce effects and result in higher power consumption.

SUMMARY OF THE INVENTION

The present invention includes a data transmission system and method of encoding data that may generate clock inclusive low DC component encoded values. Clock inclusive encoded values may rely on a strobe signal value to offset DC components of certain encoded data values.

According to one aspect of the invention, encoded values may be essentially DC balanced with respect an entire encoded value, and with respect to a portion of an encoded value. More particularly, an 8-bit data value may be encoded into a 10-bit encoded value. Such a 10-bit encoded value may include two 5-bit portions that are essentially DC balanced themselves.

According to another aspect of the embodiments, encoded values may have one value corresponding to one strobe value, and a complementary value according to another strobe values.

According to another aspect of the embodiments, encoded values may have clock inclusive coding having DC components greater than −2 and less than +2. In one particular arrangement, encoded values corresponding to a high strobe value may have DC components no less than −2 or greater than 0. That is, the number of zeros may not exceed the number of ones by more than two. Encoded values corresponding to a low strobe value may have DC components no greater than 2 or less than 0. That is, the number of ones may not exceed the number of ones by more than two.

According to another aspect of the embodiments, encoded data values and a strobe signal may be transmitted over data lines between a transmitting portion and a receiving portion. A receiving portion may include a number of differential receiver circuits that receive a reference voltage. A reference voltage may be generated by a virtual center tap arrangement that may sum incoming encoded data values and a strobe value to generate a reference voltage.

According to another aspect of the embodiments, portions of a data value may be received in parallel and encoded by different encoding sections. Encoded values from different encoding sections may then be interleaved with one another and transmitted.

According to another aspect of the embodiments, encoded data values may be received in an interleaved fashion and decoded by different encoding sections. Decoded values may then be output in parallel to form a single output data value.

According to another aspect of the embodiments, clock inclusive low DC component encoded data values may be transmitted by point to point transmission lines from a transmitting portion to a receiving portion. Termination impedance may be provided to minimize signal reflectance.

According to another aspect of the embodiments, encoded data values may include control values. Control values can include idle values that are essentially DC balanced. Control values may further include stress codes that are not essentially DC balanced. Stress codes may generate higher noise environments and/or generate reference voltages that are higher than or lower than an optimal value.

According to another aspect of the embodiments, a control codes may be applied that place data lines at the same value for more than one strobe cycle, and then transition all data lines simultaneously. Such a transition can allow for better skew evaluation.

BRIEF DESCRIPTION OF THE DRAWINGS

FIG. 8 is a table showing and encoding approach according to one embodiment.

FIGS. 9A to 9C are tables showing examples of particular codes according to one embodiment.

FIGS. 10A to 10K are tables showing examples of particular stress codes according to one embodiment.

FIG. 11 shows an arrangement of stress codes according to one embodiment.

FIG. 12A is a table showing possible frame and idle codes according to one embodiment. FIG. 12B is a timing diagram showing portions of frame codes. FIG. 12C is a timing diagram showing portions of idle codes.

FIG. 13 is a schematic diagram showing an encoding circuit according to one embodiment.

FIG. 14 is a diagram showing a functional description of an encoder according to one embodiment.

FIG. 15 is a schematic diagram showing a decoding circuit according to one embodiment.

FIG. 16 is a diagram showing a functional description of a decoder according to one embodiment.

FIGS. 17A and 17B show layout of signal lines according to various embodiments FIG. 18 is a block diagram showing a first conventional data transmission system.

FIG. 19 is a block diagram of a second conventional data transmission system.

FIG. 20 is a block diagram of a third conventional data transmission system.

DETAILED DESCRIPTION OF THE EMBODIMENTS

Various embodiments will now be described in conjunction with a number of diagrams. The embodiments set forth a clock inclusive code and method of encoding/decoding having a low DC component. Such an arrangement can allow for a receiving circuit that can average incoming signals to generate a pseudo-ground reference voltage, thereby obviating the need for a separate reference voltage generator. In addition to encoding data values, the code and method of encoding can include particular codes for enabling stress testing of components/systems, as well as clock skew detection. Still further, the code and method of encoding may be "monotonic." That is, if data values are consecutively larger than one another, once encoded, such encoded data values remain consecutively larger than one another.

System

Figure 1:
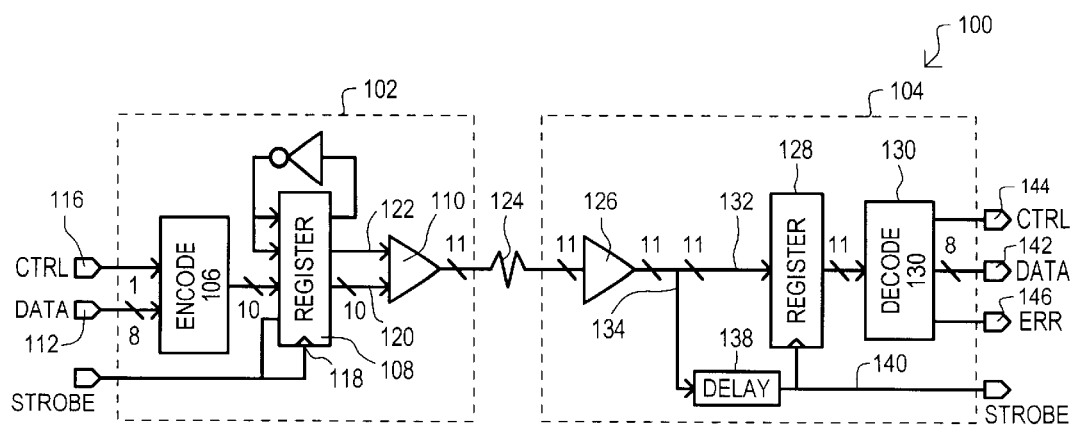
FIG. 1 is a block schematic diagram of a first embodiment.

Referring now to FIG. 1, a block diagram is set forth illustrating a data transmission system according to a first embodiment. A data transmission system is designated by the general reference character 100, and may include a transmitting portion 102 and receiving portion 104. A transmitting portion 102 may include an encoder circuit 106, a register circuit 108, and a driver circuit 110.

An encoder circuit 106 may receive a predetermined number (n) of data bits in parallel on data inputs 112. Such n data bits may be encoded into encoded values of m bits, where m>n, and where each encoded data value has a low DC component taking into account a strobe signal value. Thus, unlike other conventional approaches that may seek to lower a DC component considering only particular encoded data bit values, the present invention includes a strobe value (on both a low and high cycle) in arriving at a low DC component.

In the particular example of FIG. 1, an encoder circuit 106 can encode an 8-bit input data word into a 10-bit, strobe encoded data word that can have a low DC component when a strobe value is considered. Because both high and low strobe levels are accounted for in arriving at an encoded value, an encoder circuit 106 may also receive a strobe signal. In FIG. 1, a strobe signal may be provided by strobe signal path 114.

In addition to providing a particular clock inclusive, low DC component encoding scheme, the first embodiment 100 also illustrates how additional control codes can be generated. Control codes may serve a variety of functions. Control codes may be useful for framing the start and end of a data packet. Additionally, control codes can be used to measure signal skew. Still further, control codes may include normally "illegal" codes (i.e., codes having DC components outside the limits for non-control codes) that can enable a component/system to be "stress" tested.

In the particular example of FIG. 1, control codes may be generated by providing one or more control inputs 116 to an encoder circuit 106. When a control input 116 has one particular value (e.g., 0 in the example), an encoder circuit 106 may generate encoded data output values. In contrast, when a control input 116 has one particular value (e.g., 1 in the example), an encoder circuit 106 may generate control codes that correspond to particular data input values. Particular examples of control codes will be described at a later point herein.

Encoded data values (or control codes) generated by encoder circuit 106 can be provided to register circuit 108. According to a system strobe input 118 a register circuit 108 may output encoded data values (or control codes) on data output lines 120. Such a strobe input 118 may also provide a strobe signal to a register circuit 108. In addition, a register may also output a strobe signal on a strobe output line 122.

Values on data output lines 120 and strobe output line 122 may be driven on point-to-point connection 124 by driver circuit 110. As noted, in the particular example of FIG. 1, data values are encoded into 10-bit encoded data values. Such 10-bits, when added with a strobe signal, result in an 11-bit point-to-point connection 124.

It is noted that by providing a clock inclusive low DC component output value on point-to-point connection 124, adverse effects of ground bounce, or the like, can be reduced over conventional approaches that may generate values with higher DC components.

Particular approaches to encoder circuits and encoding methods will be described in more detail at a later point herein.

Referring to FIG. 1 once again, a receiving portion 104 may include a receiver circuit 126, a register circuit 128, and a decoder circuit 130. A receiver circuit 126 may receive a DC balanced clock inclusive code, and amplify, or otherwise drive data input lines 132 and a clock input line 134. As will be described in more detail below, in one particular arrangement, a receiver circuit 126 may include a virtual center-tap with respect to point-to-point connection 124 for generating a reference voltage.

Data input lines 132 and strobe input line 134 can supply received encoded data values and a strobe value to register 128. A received strobe signal on strobe input line 134 can also be conditioned to strobe register circuit 128, and thus pass on encoded data values and a strobe value to a decoder circuit 130. In the particular example of FIG. 1, a received strobe signal can be supplied to a delay circuit 138. The resulting signal may then be supplied to register circuit 128 and as a system strobe input 140.

It is noted that by transmitting a strobe signal with encoded data along point-to-point connection 124, the same transmitted strobe signal can be used to strobe in, or otherwise detect a transmitted data values. Such an approach can eliminate the need for a phase-lock-loop or the like, included in conventional cases for recovering an embedded strobe signal, or otherwise extracting data at a desired clock rate.

Encoded data values and a strobe value can be output to decoder circuit 130. A decoder circuit 130 can decode encoded values and generate data values on data outputs 142. In the case of embodiments that include control codes, a decoder circuit may also output one or more control values at control output 144. Still further, the example of a FIG. 1 includes an error output 146 that can flag an erroneous decode operation (e.g., invalid/unknown/corrupt input value).

In this way, a system may include a transmitting portion 102 and/or a receiving portion 104 that may accommodate clock inclusive, low DC component encoding.

A second embodiment will now be described with reference to FIG. 2.

Figure 2:
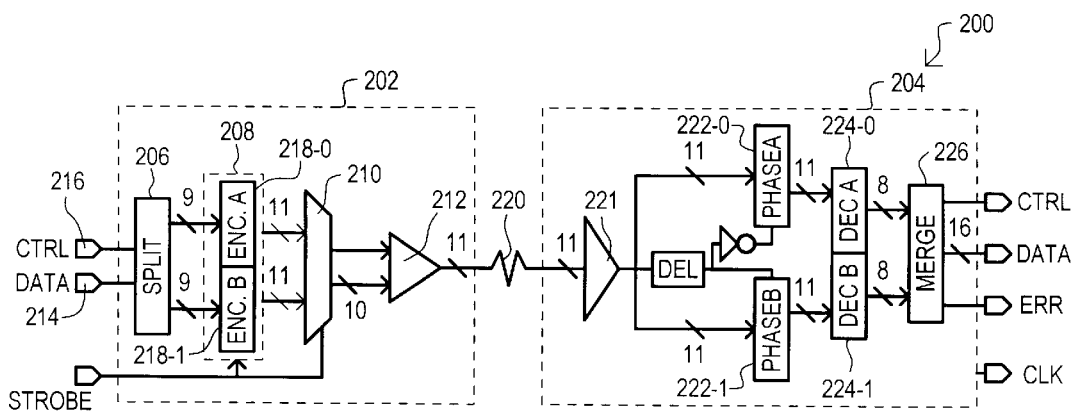
FIG. 2 is a block schematic diagram of a second embodiment.

Referring to FIG. 2, a second embodiment is designated by the general reference character 200 and is shown to include a transmitting portion 202 and a receiving portion 204. A second embodiment 200 can allow more time for encoding operations to take place by processing data in multiple chunks, in parallel, and then interleaving resulting encoded chunks. The particular example of FIG. 2 splits encoding operations two processes. However, it is understood that alternate embodiments could process larger numbers of chunks (four chunks, eight chunks etc., as but a few examples).

A transmitting portion 202 may include a splitting section 206, an encoding circuit 208, a multiplexer (MUX) 210, and a driver circuit 212. A splitting section 206 may receive incoming data on data inputs 214. As in the case of the first embodiment 100, one or more control signals may be received at a control input 216. A splitting section 206 may then split incoming data into a number of chunks. In the particular example of FIG. 1, a 16-bit input value may be split into two 8-bit chunks. Each chunk may be processed (i.e., encoded) separately in encoding circuit 208.

An encoding circuit 208 may include encoding sections 218-0 and 218-1 corresponding to each chunk that is processed. Thus, in the example of FIG. 1, encoding section 218-0 may receive one 8-bit chunk while encoding section 218-1 may receive the other 8-bit chunk. A second embodiment 200 may also allow for control codes. Consequently, each encoding section (218-0 and 218-1) may also receive a control input 216. As but one possible arrangement, according to a control input 216 value, an encoding section (218-0 and 218-1) may generate encoded data output values or control codes. In the particular example of FIG. 2, 8-bit chunks are encoded into 10-bit encoded values or 10-bit control codes are provided.

In one very particular arrangement, an encoding circuit 208 may be clocked on rising edges of a strobe signal, and output one set of encoded values (ENC A) when strobe is high, and another set of encoded values (ENC B) when strobe is low.

Outputs from encoding sections (218-0 and 218-1) can be provided as inputs to a MUX 210. A MUX 210 may also receive a MUX control value as an input. A MUX control value can selectively output values received from each encoding section (218-0 and 218-1). In the example of FIG. 2, because a data value is split into two chunks, a MUX 210 may be controlled by a strobe signal, which may be a system clock divided by 2. Each encoded chunk value (or control code) may be output with a strobe signal that may be generated in the same general fashion as that shown in FIG. 1 (output from a register 108). In addition, or alternatively, an encoding section 218-0 may provide a strobe output value that is always high, while an encoding section 218-1 may provide a strobe output value that is always low. Such high and low strobe value may then be alternatively provided as a strobe signal that is transmitted over point-to-point connection 220.

In the example of FIG. 2, alternating encoded chunk values may be provided by a controlling a MUX 210 according to a strobe signal. In other approaches, in which a data input value may be split into more than two chunks, alternate timing schemes may be used to control a MUX 210. Such timing schemes may include, but not be limited to, applying a strobe signal to a pulse generator. Such pulses may then be delayed enable different signal paths within a MUX 210 on consecutive strobe values.

Encoded chunk values (or control codes) and a strobe signal output from a MUX 210 may be driven on point-to-point connection 220 by driver circuit 212. As noted, in the particular example of FIG. 1, data values are encoded into 10-bit encoded data values. Such 10-bits, when added with a strobe signal, result in x11 point-to-point connection 220.

A receiving portion 204 according to a second embodiment 200 may include a receiver circuit 221, different phase register circuits 222-0 and 222-1, decoder sections 224-0 and 224-1, and merging section 226. As in the first embodiment 100, a receiver circuit 220 may receive a DC balanced clock inclusive codes, and amplify, or otherwise drive data input lines and a strobe input line. A virtual center-tap arrangement may also be used to arrive at a reference voltage.

A received strobe signal can then be used to store interleaved data in different phase register circuits (222-0 and 222-1). In the example of FIG. 2, because two encoded chunks are interleaved, such a storing step may be accomplished by delaying a received strobe signal with a delay circuit 228. Such a delayed strobe value may be used to alternately enable different phase register circuits (222-0 and 222-1) on consecutive changes in value.

Of course, in event data values were encoded into more than two encoded chunks, alternate timing arrangements could be used to activate more than two different phase register circuits at different points in time.

Encoded chunks (or control codes) received by different phase register circuits (222-0 and 222-1) may be decoded by corresponding decoder sections (224-0 and 224-1). Decoded chunks may then be recombined by a merging section 226 to provide a data output value, along with a control value. An error value may also be provided to reflect an error in one or both of the decoding operations.

Figure 3A:
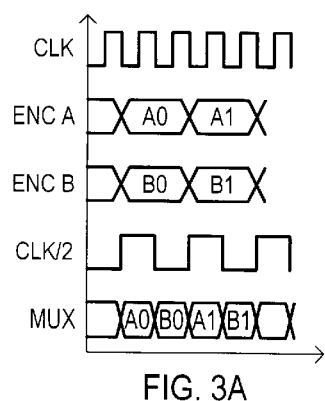
FIGS. 3A and 3B are timing diagrams illustrating the operation of embodiments that interleave encoding results.
Figure 3B:
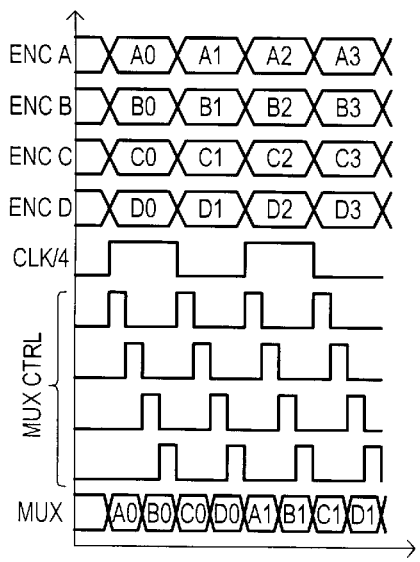

A timing diagram illustrating the operation of a transmitting portion 202 that interleaves two encoded chunks is shown in FIG. 3A. A timing diagram showing the operation of a transmitting portion that interleaves four encoded chunks is shown in FIG. 3B.

In this way, in the event an encoding operation or decoding operation may require more time than one system clock signal, values may be encoded by concurrent processing and then transmitted in an interleaved fashion. Decoding may then occur with concurrent processing.

Having described various embodiments, particular examples of circuits that may be used in such embodiments will now be described.

Figure 4:
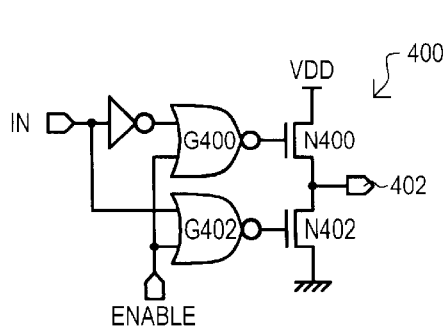
FIG. 4 is a schematic diagram of a transmitter circuit according to one embodiment.

FIG. 4 shows one example of a transmitter circuit 400. A transmitter circuit 400 may be repeated multiple times to form a driver circuit, such as that shown as items 110 and 212 of FIGS. 1 and 2, respectively.

Referring to FIG. 4, a transmitter circuit 400 may include n-channel driver transistors N400 and N402 arranged in series between a high power supply VDD and a low power supply (ground). The gate of transistor N400 can be driven by a NOR gate G400 while the gate of transistor N402 may be driven by a NOR gate G402. NOR gates (G400 and G402) may receive complementary data values as inputs. Both NOR gates (G400 and G402) can also receive an enable value as an input. As is well understood, when an enable signal is high, transistors N400 and N402 can be turned off, placing bit driver circuit in a tri-state. When an enable signal is low, if an input value is low, transistor N402 will turn on, driving an output node 402 to a low voltage. If an input value is high, transistor N400 will turn on, driving an output node 402 to a high voltage. Standard CMOS drivers could also be used, and would more typically be used for smaller supply voltages.

Figure 5:
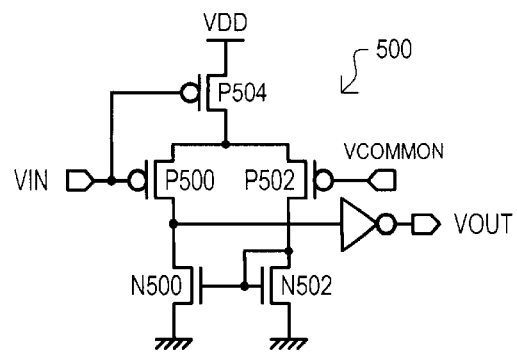
FIG. 5 is a schematic diagram of a receiver circuit according to one embodiment.

FIG. 5 shows one example of a receiver circuit 500. A receiver circuit 500 may be repeated multiple times to form a receiver circuit, such as that shown as items 126 and 221 of FIGS. 1 and 2, respectively. The particular receiver circuit 500 may be compatible with the Gunning Transceiver Logic (GTL) interface standard.

Referring to FIG. 5, according to one particular approach, a receiver circuit 500 may be a differential type amplifier. A receiver circuit may include a differential pair of transistors P500 and P502 commonly coupled to a current source P504. Differential pair P500 and P502 may also be connected to an active load N500 and N502. As is well understood, when an input value Vin supplied to the gate of one differential pair transistor P500 falls below that of a reference voltage Vref supplied to the gate of the other differential pair transistor P502, a sense node 502 potential may vary. In the particular case of FIG. 5, when an input value Vin is greater than Vcommon, sense node 502 is pulled low. When an input value Vin is less than Vcommon, sense node 502 is pulled high. A sense node value 502 may be inverted, as shown in FIG. 5.

Of course, while particular transmitter/receiver circuits have been illustrated in FIGS. 4 and 5, such circuits represent but two of many possible examples, and should necessarily be construed as limiting the invention thereto.

As noted above, embodiments of the present invention may include a reference voltage generating arrangement that may eliminate the need for a separate circuit dedicated to generating a reference voltage. Such an advantage can reduce the complexity of a transmission system and/or enable such a transmission system to be employed over a wider range of applications.

Figure 6A:
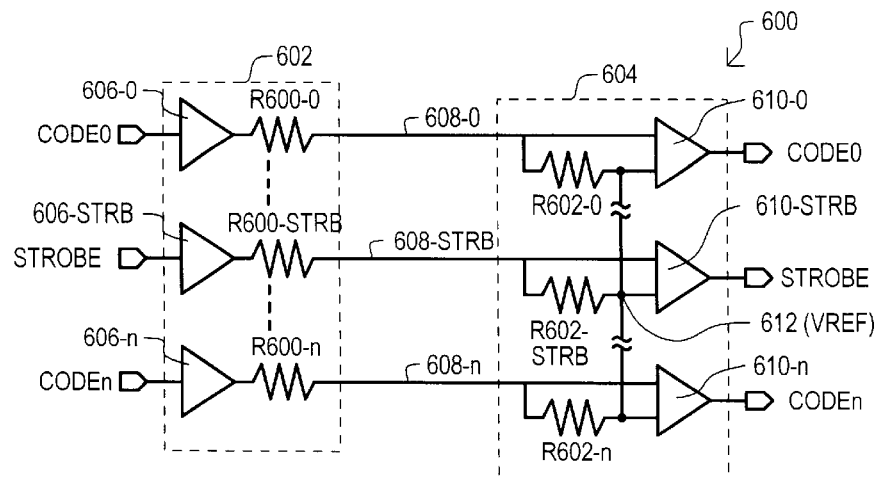
FIG. 6A is a schematic diagram showing a virtual center tap arrangement for generating a reference voltage, according to one embodiment.

One example of a reference voltage generating approach according to the present invention is illustrated in FIG. 6A. FIG. 6A is a schematic diagram showing a first example of a virtual center-tap arrangement. FIG. 6A includes a transmitting portion 602 and receiving portion 604. A transmitting portion 602 may include transmitting circuits 606-0 to 606-n. Transmitting circuits (606-0 to 606-n) may drive connection lines 608-0 to 608-n according to received encoded data values (or control codes).

A receiving portion 604 may include a number of receiving circuits 610-0 to 610-n. Receiving circuits (610-0 to 610-n) may be differential-type amplifier circuits having differential inputs. A first differential input of each receiving circuit (610-0 to 610-n) may be coupled to a connection line (608-0 to 608-n). A second differential input of each receiving circuit (610-0 to 610-n) may be commonly coupled to a virtual center tap node 612. In addition, connection lines (608-0 to 608-n) may be commonly coupled to a virtual center tap node 612 by way of termination impedance, shown as resistance R602-0 to R602-n in FIG. 6. Transmitting side termination impedance is shown as resistance R600-0 to R600-n. Of course, termination impedance (R600-0 to R600-n and R602-0 to R602-n) may be selected according to well known techniques to minimize signal reflectance according to line impedance and drive voltage.

In such an arrangement, a virtual center tap node 612 can provide a common reference voltage for receiving circuits (610-0 to 610-m). Further, such a reference voltage may include an average of all incoming encoded data values and the strobe signal connection lines (608-0 to 608-m). As previously noted, encoded data values when considered with a transmitted strobe value, have a low DC component. Consequently, a reference voltage may be very close to midway between a logic high potential and a logic low potential. In this way, a reference voltage that may be reliable and accurate can be generated without the need for a conventional reference voltage generating circuit.

Figure 6B:
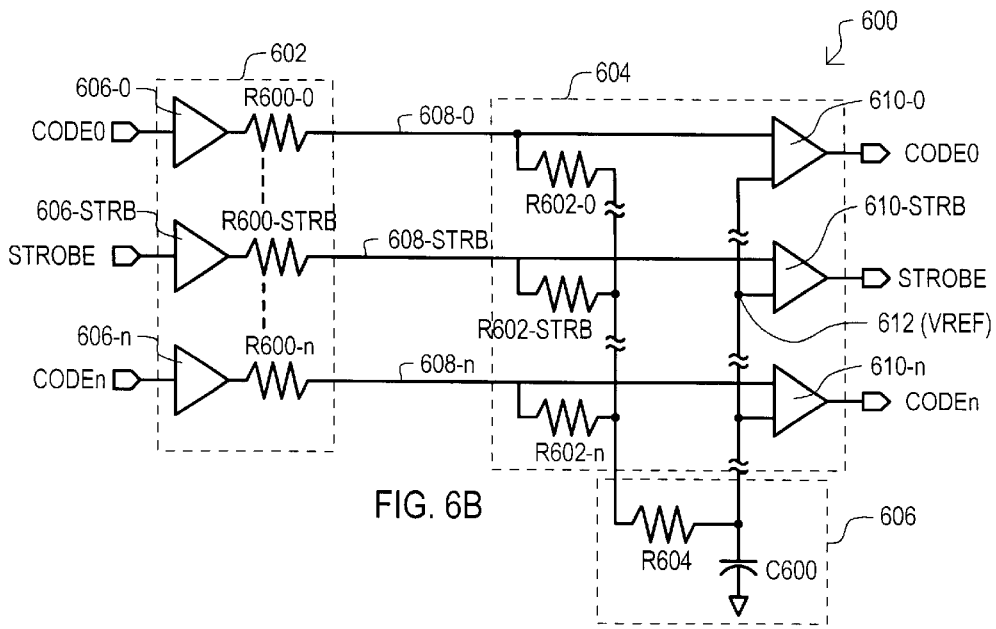
FIG. 6B is a schematic diagram showing a virtual center tap arrangement for generating a reference voltage, according to another embodiment.

A second example of a virtual center-tap arrangement is shown in FIG. 6B. FIG. 6B includes many of the same components as FIG. 6A, to that extent like components are referred to by the same reference character. Unlike FIG. 6A, FIG. 6B also includes a filtering section 606. A filtering section 606 may filter a resulting center tapped reference voltage. In the particular case of FIG. 6B, a filtering section 606 may be a low pass filter that includes a resistor R606 and a capacitor C600. Such an arrangement may advantageously filter out changes in a reference voltage that may arise when a data or clock signal arrives before the other signals.

Figure 7A:
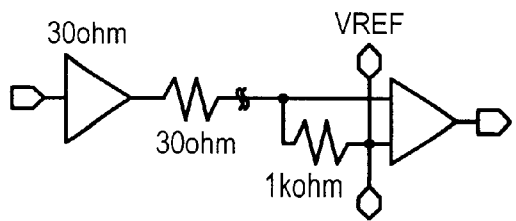
FIGS. 7A to 7C are schematic diagrams showing termination techniques according to various embodiments.
Figure 7B:
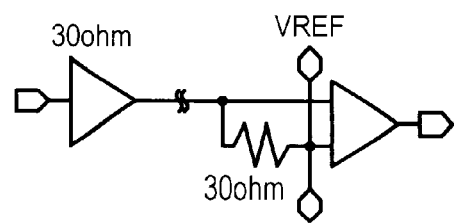
Figure 7C:
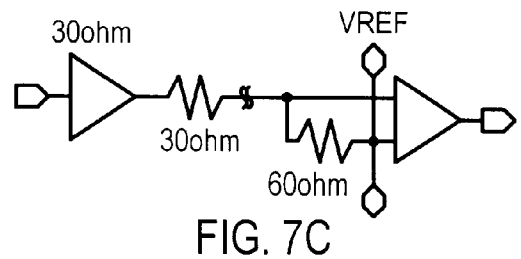

Particular examples of specific termination techniques are shown in FIGS. 7A to 7C. FIG. 7A shows a series termination arrangement. In such an arrangement, a transmitter impedance may be matched to transmission line impedance of a point to point connection. A receiving impedance may be substantially larger than a transmission line impedance. FIG. 7B shows a parallel termination arrangement. In such an arrangement, a receiver impedance may match a transmission line impedance. FIG. 7C shows a double termination arrangement. In such an arrangement, receiver and transmitter impedance may match transmission line impedance. Of course, the particular termination resistances shown are examples, and should not be construed as limiting the invention thereto.

Code

Having described circuits that may be included in data transmission systems according to the present invention, a particular encoding scheme according the present invention will now be described.

According to the present invention, data values of size n can be encoded into codes of size m, where m is greater than n. Such codes can be essentially balanced when included with a strobe signal. Still further, according to the present invention, a code of size m may be split into smaller portions, with such portions also being essentially balanced when included with a strobe signal.

Because codes balancing can depend upon a strobe value, code values can vary according to a strobe signal. According to one particular embodiment, code values for one strobe signal value can be the logical complement of code signal for a different strobe signal value. One such approach is shown generally in FIG. 8.

Clock Dependent Encoding/Decoding

FIG. 8 shows a table illustrating one example of an encoding approach according to one embodiment. In the particular example of FIG. 8, input values in the range of 0–299 (decimal) may be received. For input values from 0–127, when a strobe signal has one value (0 in the example) encoding may occur according to a set of values ~Code0. Conversely, when a strobe signal has another value (1 in the example) encoding may occur according to a set of values Code0, which may be the logical complement of the Code0 values. In a similar fashion, input values 128–255 may be encoded into a set of values ~Code1 or Code1 according to a strobe signal, while input values 256–299 may encoded into a set of values ~Code2 or Code2 according to a strobe signal. Values Code1 and Code2 may be the logical complements of values ~Code1 AND ~Code2, respectively.

It is additionally noted that FIG. 8 can represent the encoding of eight bit values (0–255) into ten (or more) bit values. Thus, the encoding of values 0–127 and 128–255 can be considered "data" encoding. Remaining values 256–299 can represent encoding of "code" values. Code values may be values in addition to data values that are encoded for use in a system. Like data values, control values may have one set of value (Code2(data)) when a strobe is 1, and another set of values (~Code2(data)) when a strobe is 0.

Clock Inclusive Low DC Component Codes

Particular examples of encoding tables are shown in FIGS. 9A to 9C. FIG. 9A shows an example of a Code0 set of values, FIG. 9B shows an example of a Code1 set of values, and FIG. 9C shows an example of Code2 set of values. Data values are shown in "data" columns. Corresponding encoded values are shown in "code" columns. It is understood that the values of FIGS. 9A to 9C are intended to be inclusive with a "high" strobe signal. Thus, ~Code0, ~Code1 and ~Code2 values can be derived by taking the logical inverse of the encoded values of FIGS. 9A to 9C. Further, the "code" columns include a strobe signal, in the center of each value, separated from code bits by dashes.

As noted above, because FIGS. 9A to 9C are to be inclusive with a high strobe signal, such values are derived to be essentially balanced when added with a high strobe value. More particularly, selected code values will have a first DC component when considered individually, and a second DC component that is less than the first DC component when considered with a corresponding strobe signal.

For example, the DC component of clock inclusive code values may have DC components that are greater than −2 and less than +2.

In the example of FIGS. 9A to 9C, all code values have a DC components of 0 or −2. Thus, when considered with a high strobe signal, an overall DC component for a transmitted clock inclusive encoded value can be +1 or −1. Accordingly, such codes would have DC components that are greater than −2 and less than +2. It follows that codes corresponding to a low strobe value can have the same range of DC components (i.e., such codes alone would have DC components of 0 or +2, and when considered with a low strobe signal would have DC components of −1 or +1. The DC components of these codes would thus also be greater than −2 and less than +2).

In this way, clock inclusive code values according to the present invention may have DC components having an absolute value that is no greater than one. When such codes are considered alone, the DC components may have absolute values greater than one. This is in contrast to conventional approaches, which may seek to minimize the DC components of codes exclusive of a clock signal.

According to the present invention, a code may also be fractionally balanced. That is, a code may be divided into more than one portion, with each portion being essentially DC balanced.

In the particular example of FIGS. 9A to 9C, each 10 bit code value may be conceptualized as including a first 5-bit portion and second 5-bit portions. Each 5-bit portion can be essentially DC balanced. As but one example, for data value "0000 0000" a code may include a first portion "00101" having a DC component of −1 and a second portion that also has a DC component of −1. Thus, each portion has a DC component having an absolute value of no greater than 1.

As noted above, FIGS. 9A and 9B show encoding of data values. FIG. 9C shows encoding of control values. In this way, a clock inclusive DC balanced code may further be fractionally balanced, more particularly, half balanced.

Monotonic Encoding

An examination of FIGS. 9A to 9C shows another aspect of embodiment. Namely, the illustrated code is monotonic. That is, for strobe values of "1," if a first input data value is greater than a second input value, the encoded first input value will also be greater than the encoded second input value. Such an arrangement may allow certain data operations (e.g., those that involve relative magnitudes) to occur prior to decoding, further increasing the processing speed of a system.

Control Codes

According to the present invention, a code may also include control codes that can enable additional features in a system. Such control codes may include idle codes, stress codes, and skew detection codes.

In a system, there may be times when a point-to-point connection is not transmitting data (is idle). To indicate such a state, it can be desirable to transmit an idle code. According to the present invention, like encoded data values, an idle code may be a clock inclusive low DC component code. In addition, or alternatively, as will be described below, an idle code may result in essentially static values on data lines as a strobe signal transitions. In the case of an idle code with a low DC component, such an idle code may reduce power, while at the same time allowing a strobe signal to be transmitted over a point to point connection. An idle code may have a DC component of zero. For example, one particular 10-bit idle code could be "11001 11000." In such a case, when considered in conjunction with a strobe signal, a DC component could be +1 when a strobe is high and −1 when a strobe is low. However, it is understood that an idle code could also have a DC component of −2 when a strobe signal is high and +2 when a strobe signal is low. Thus, when considered in conjunction with a strobe, the overall DC component would be −1 or +1.

In this way, a DC balanced idle code may also be clock inclusive. It is also noted that the example described above is also half balanced.

The particular code example shown in FIGS. 9A to 9C has been constructed to provide a clock inclusive low DC component code. Such an approach can provide low power, low noise transmission of data over a point to point connection. Still further, by including a virtual center tap arrangement, such low DC component codes may generate a reference voltage. Thus, a code according to FIGS. 9A to 9C can represent an optimal operational code.

Control codes, like data codes may have one value on a strobe value of 1, and another on a strobe value of 0.

Stress Codes

As noted previously, it is often desirable to understand how a system and/or component may perform in non-optimal conditions. Such non-optimal conditions may include higher noise environments, offset errors in differential receivers, and/or particular sensitivities of a point to point connection. To meet such a need, the present invention may further include stress codes in addition to optimized low DC component clock inclusive codes.

Stress codes may be essentially unbalanced with respect to a DC component. Such an unbalance may occur over all bits of a code and/or may occur over a fraction of the code. Transmitting stress codes over a system can determine how robust a system/component is. For example, unbalanced codes, when used in conjunction with a virtual center tap arrangement (such as that described above), can generate biased reference voltages (i.e., reference voltages that are higher/lower than the ideal case). Such biased reference voltage may be used to determine offset voltages for differential receivers, as but one example.

It is also noted that stress codes may generate more noise than balanced codes. Such additional noise may also be used to test or otherwise examine the operation of a system under non-optimal conditions.

Still further, particular types of stress codes may be consecutively transmitted to determine whether a point to point connection, or portions thereof may be sensitive to particular noise conditions. Of course, the above examples represent but a few of the possible applications for stress codes. Testing may vary considerably according to particular applications.

In this way, stress codes may provide a relatively easy way to test various parameters of a system and/or component.

Particular stress codes related to an 8 to 10 bit encoding are set forth in a series of tables in FIGS. 10A to 10K. The various tables are identified as StressABiasB. A value A can be the number of 1s in a 10-bit code, while a value B can represent an unbalance in 1s between 5-bit portions. For example, FIG. 10A shows Stress6Bias3 codes. For a data value "0000 0000" the resulting code is "00001-1-01111" (when a strobe value is high). The overall number of 1s (including the high strobe value) is 6, but the last five bits have three more 1s than the first five bits. It is understood that the various stress code tables shown may have complementary tables of complementary values. Thus, the complementary table of Stress6Bias3 can be Stress6Bias3.

Stress codes, when considered with a strobe, can be further be characterized into particular groups according to a resulting DC bias and unbalance between portions. Such a characterization is shown in FIG. 11. In FIG. 11, stress codes may be categorized into tests. Tests are identified as SumC_BiasB. A value C can be an overall DC component for all bits. A bias value can be an unbalance between 5 bit portions, previously described.

Static Idle Codes and Skew Test Codes

In some cases it may be desirable to have certain codes which remain the same while a strobe value transitions. Two possible cases may be idle codes and skew test codes. In encoding procedures according to the present invention, transmission lines may switch according to transmitted data values. Consequently, it can be difficult to determine clock skew for such signals as transitions may occur every half cycle of strobe. According to embodiments of the present invention, particular codes may be generated to enable a determination and/or evaluation of clock skew. Such codes may maintain data transmission lines at one level for more than one strobe signal transition and then transition essentially simultaneously.

FIG. 12A shows one example of control codes that may be used for skew determination. Included is an IDLE code, a FRAME0 code, and a FRAME1 code.

One of the many possible examples of a skew detection set of codes is shown in FIG. 12B. In FIG. 12B the values corresponding to FRAME0 and FRAME1 may be used. For example, the value for FRAME0 (00011 001 11) may be used for a first strobe value (from zero to one). In the next transition of a strobe, the value for FRAME1 (11100 11000) may be used. It is noted that this is the inverse of the code for FRAME0. In the next two transitions of a strobe, the value for FRAME0 may be used. In this way, data values may transition at the same time at essentially half the strobe cycle (and ¼ of the clock cycle). Such a simultaneous transition in signals may allow for better determination of signal skew. Of course, such signals may be used for more consecutive transitions on a strobe signal than just two.

In this way, the present invention may include particular codes that have the same value on both a high strobe value and low strobe value for assisting in the evaluation of skew.

In the case of idle codes, it may be desirable to maintain all or a substantial portion of the data lines at one value, while the strobe continues to transition. One of the many possible such idle codes is shown in FIG. 12C.

FIG. 12C shows a timing diagram illustrating an implementation of idle detection codes of FIG. 12A. FIG. 12C shows four data values D3, D4, D5 and D6. Such data values maintain the same value despite changes in the strobe signal. Such an approach to an idle code may consume less power in an idle state as data lines do not may transitions. Further, electromagnetic interference may also be reduced, as only a strobe signal is transitioning. Further, such a strobe signal may be contained in a loop area defined by the surrounding data lines (in embodiments where a strobe signal is surrounded by data lines).

Having described particular codes according to an embodiment, encoder/decoder methods and circuits will now be described in detail.

Encoder and Decoder

An encoder according to one embodiment is shown in FIG. 13 and designated by the general reference character 1300. An encoder 1300 may receive data and control values at a data/control input 1302 and a strobe signal at a strobe input 1304. Data/control values can be divided by 10, in a divide-by-10 circuit 1306. A divide-by-10 circuit 1306 can provide a division result value as well as a remainder (i.e., modulus) value. The particular example of FIG. 13 can generate codes according to FIGS. 9A to 9C. Consequently, an encoder 1300 may receive a 9-bit data/control input and provide a 5-bit result and a 4-bit remainder.

A result can be provided to a first look-up type circuit 1308. In one particular arrangement, a first look-up type circuit 1308 may include a read-only-memory (ROM). In the particular example shown, such a ROM may include at least 30 entries of at least 7 bits. In response to result values, a first look-up type circuit 1308 may provide a first portion of an encoded value to a complementing circuit 1310. In addition, a portion of a first look-up type circuit 1308 can provide a select value to a range selecting circuit 1312.

A range selecting circuit 1312 can provide second portion values to a second look-up type circuit 1314. In the example of FIG. 13, a range selecting circuit may receive a select value a that may range from 0 to 2. This value may be multiplied by 10 and added to a remainder value. A resulting 5-bit value may be provided to a second look-up type circuit 1314. In one particular arrangement, a second look-up type circuit 1314 may include a read-only-memory (ROM) having at least 30 entries of at least 5 bits.

A second look-up type circuit 1314 may provide a second portion of an encoded value to a complementing circuit 1310. Depending upon a strobe signal value, a complementing circuit 1310 can complement the encoded value portions provided from the first and second look-up type circuits (1308 and 1310). A resulting output from a complementing circuit 1310 can be an encoded data value.

While a specific encoding circuit is shown in FIG. 13, such encoding may be performed by a more general purpose processor executed a series of predetermined steps. Still further, a functional description of an encoding operation may be synthesized into hardware by various well known techniques. Accordingly, an example of a functional description of encoding operation is set forth in FIG. 14 in C-code.

Arrays may be utilized to store code values. More particularly, in FIG. 14, array encodeHi[30] may store first portion code values, while arrays encode10[10] and encode20[20] may store second portion code values. An Encoder function can derive a data value that may take into account a control input "strobe". In one arrangement, an Encoder function can also provide a code output or complementary code output depending upon a strobe value.

An Encoding function can access selected array values according to a formula to generate clock inclusive low DC component encoded values. In the particular example of FIG. 14, data value may be divided by 10 to index array encodeHi[30]. An array value from encodeHi[30] can be shifted one direction to yield a first portion of an encoded value. Another part of the same array value "hiCode" may yield a type value. A type value may index arrays code10 [10] and code20[20] with the modulo 10 of the data value.

Of course, the particular description of FIGS. 13 and 14 represent but two possible examples of encoding approaches, and should not be construed as limiting the invention thereto.

Having described two encoder examples, decoder examples will now be described.

A decoder according to one embodiment is shown in FIG. 15 and designated by the general reference character 1500. A decoder 1500 may receive an encoded data value at a data/control input 1502 and a strobe signal at a strobe input 1504. According to a received strobe signal, a data value can be complemented by a complementing circuit 1506. One portion of a received (possibly complemented) encoded value can be supplied to a first look-up type circuit 1508. A second portion of an encoded value can be supplied to second and third look-up type circuits 1510 and 1512.

A first look-up type circuit 1508 may provide a number of different outputs. Valid received values can result in a data value (DATAHI) and a type value. Invalid received data values can generate an error signal. In a similar fashion, second and third look-up type circuits (1510 and 1512) can receive a second portion of an encoded value and provide output values and/or error values.

A decoder circuit 1500 may also include first and second multiplexers (MUXs) 1514 and 1516. According to a type value provided from a first look-up circuit 1508, an error value and data value from a second or third look-up type circuit (1510 or 1512) can be output from first and second MUXs (1514 and 1516). A logic gate 1518 can logically sum error values to provide an error output. A summing circuit 1520 can combine data values from a first type look-up circuit 1508 and second MUX 1516 to generate a decoded value. In the particular example of FIG. 15, a summing circuit 1520 can multiply an output value provided from a first look-up type circuit 1508 by ten, and then add the result to an output value from second MUX 1516.

Like the encoding examples, decoding may be performed by a more general purpose processor executed a series of predetermined steps, or described in functional form. Accordingly, a particular example of a decoding operation is set forth in FIG. 16 in C-code form.

In FIG. 16, arrays may be utilized to index value for deriving a decoded value. More particularly, in FIG. 16, array decodesHi[32] may store index values corresponding to a higher portion of a decoded value. Arrays decode10[32] and decode20[32] may store second portions of decoded values. A Decode function may complement a data value according to a strobe value. A received encoded value may then be shifted to derive a first portion of an encoded value (hi). Such a first portion may then index array decodeHi[32] to generate a hiCode value. A hiCode value may include an indexed number as well as an indexed type value.

A second portion of an encoded value (lo) can be derived by a logical operation. Such a value (lo) may be used to index either an array decode10[32] or decode20[32] according to a type value hi-Type from a decodeHi[32] array. An indexed number from a decodeHi[32] array can be multiplied by ten and added to a number generated from either decode10[32] or decode20[32] to generate a decoded value. An error value can be generated in the event indexing any of the arrays decodeHi[32], decode10[32] or decode20[32] results in an error indication.

In this way, particular encoder and decoder arrangements can generate clock inclusive DC balanced codes.

Signal Line Layout

While the present invention can provide reduced noise effects by including low DC component clock inclusive codes, the present invention may also include advantageous layout arrangements.

In order to minimize signal skew between a strobe and data lines, a strobe line may be centrally situated with respect to corresponding data lines as shown below.

FIG. 17A shows a layout arrangement for cases where a ground plane is not available. Data lines d0–d9, ground lines 1700, and a strobe line 1702 may be situated between a transmitting portion 1704 and a receiving portion 1706. Ground lines 1700 may be interspersed between data lines (d0–d9) and a centrally situated strobe signal line 1704. Still further, ground lines 1700 may be interspersed between data line portions d0–d4 to d5–d9.

FIG. 17B shows a layout arrangement where a ground plane is available. Data lines d0–d9 and a strobe line 1702' may be situated between a transmitting portion 1704' and a receiving portion 1706'. Ground lines 1700' may be situated at the ends of data lines d0–d9 and strobe line 1706'.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A data transmission system, comprising:
    at least one encoder that encodes data input and control input values of n-bits into encoded values of m-bits, where m is greater than n, each encoded value having one set of bits when a corresponding clock signal has a first value, and a complementary set of bits when the corresponding clock signal has a second value.

2. The data transmission system of claim 1, wherein:

m is an even number and a DC component of the encoded values when added to the corresponding clock signal is less than two and greater than negative two.

3. The data transmission system of claim 1, wherein:

a DC component of the encoded values is no more than, two and greater than negative one when the corresponding clock signal is low, and greater than negative three and less than one when the corresponding clock signal is high.

4. The data transmission system of claim 2, wherein:

m is ten and n is eight, and selected of the encoded values have a DC component of 0 while other encoded values have a DC component of 2 when the corresponding clock signal is low and −2 when the corresponding clock signal is high.

5. The data transmission system of claim 1, wherein:

m is ten and the encoded values include two portions, each portion having 5 bits and a DC component with an absolute value of less than 2.

6. The data transmission system of claim 1, wherein:

the encoded values and data values are monotonic with respect to one another.

7. The data transmission system of claim 1, wherein:

m is an odd number and DC components of the encoded values are less than two and greater than negative one when the corresponding clock signal is low and greater than negative two and less than one when the corresponding clock signal is high.

8. The data transmission system of claim 1, wherein:

the at least one encoder further receives at least one control indication and generates control values instead of encoded data values when the at least one control indication is active.

9. The data transmission system of claim 8, wherein:

the control values include stress bias codes having an overall DC component that is greater than 2 when the corresponding clock signal is low and less than −2 when the corresponding clock signal is high.

10. The data transmission system of claim 8, wherein:

the control values include a clock skew evaluation sequence in which all the bits of the control value simultaneously transition from one value to a different value.

11. The data transmission system of claim 1, wherein:

the encoder generates an idle value when data input values are not transmitted as encoded values, the idle value having a DC component that is no more than two and greater than negative one when the corresponding clock signal is low and greater than negative three and no more than one when the corresponding clock signal is high.

12. A data transmission system, comprising:

a receiver having a plurality of differential receiver circuits each including a value input and a reference input, the differential receiver circuits including a plurality of data receiver circuits having value inputs coupled to data inputs and a clock receiver circuit having a value input coupled to a clock input, the reference input of the data receiver circuit and clock receiver input being commonly coupled to a reference node; and the receiver further includes at least one decoder that decodes encoded values of m-bits into data values of n-bits, where n is less than m, and the encoded values include decode-to-data values and control values, the decode-to-data and control values having one encoded value when a clock signal is high, and a different value when a clock signal is low.

13. The data transmission system of claim 12, wherein:

m is an even number and DC components of the encoded values when added with a corresponding clock signal have an absolute value no greater than one.

14. The data transmission system of claim 13, wherein:

m is ten and n is eight, and selected of the encoded values have a DC component 0 while other encoded values have a DC component of 2 when the corresponding clock signal is low and −2 when the corresponding clock signal is high.

15. The data transmission system of claim 12, wherein:

the encoded values include at least two portions having essentially the same number of bits, an absolute DC component value of each portion being no greater than one.

16. The data transmission system of claim 12, wherein:

m is an odd number and DC components of the encoded values are less than two and greater than negative one when the corresponding clock signal is low and greater than negative two and less than one when the corresponding clock signal is high.

17. The data transmission system of claim 12, wherein:

the at least one decoder includes a plurality of decoders that each receive an encoded data value and generate data values.

18. The data transmission system of claim 17, further including:

a merging circuit for merging a plurality of data values from different decoders to generate an output value.

19. The data transmission system of claim 12, wherein:

the at least one decoder further provides at least one decoded control value in conjunction with a data value and activates the at least one decoded control value when the control value is received and deactivates the at least one decoded control value when an encoded data value is received.

20. The data transmission system of claim 12, wherein:

the control values include stress bias codes having an overall DC component having an absolute value that is greater than 1.

21. The data transmission system of claim 12, wherein:

the at least one decoder includes at least one first look-up table that receives a first table input value and generates at least first portions of data values.

22. The data transmission system of claim 21, wherein:

the at least one decoder further includes at least one second look-up table that receives a second table input value and generates at least second portions of data values, the second table input values including at least second portions of encoded data values.

23. The data transmission system of claim 22, wherein:

the at least one decoder further includes selecting means for generating second portions of data values according to an index values generated from the at least one first look-up table, each index value corresponding to a first portion of a data value.

24. The data transmission system of claim 12, wherein:

the encoded data values and data values are monotonic with respect to one another.

25. The data transmission system of claim 12, wherein:
the reference node is coupled to a filter circuit.

26. The data transmission system of claim 25, wherein:
the filter circuit includes a resistance coupled to the reference node and a capacitor coupled between the reference node and a supply node.

27. A method, comprising the steps of:
converting between data and control code values and encoded values that are transmitted in parallel with corresponding half clock cycles, an absolute DC component of each encoded value when summed with the value of the corresponding half clock cycle being no greater than one.

28. The method of claim 27, wherein:
each encoded value includes an even number of bits and DC components of the encoded values corresponding to high half clock cycles are 0 or −2 and the DC components of encoded values corresponding to low half clock cycles are 0 or +2.

29. The method of claim 27, flier including:
each encoded value includes two portions of 5 bits each.

30. The method of claim 27, wherein:
the data values have 8 bits and the corresponding encoded values have 10 bits, and comprises the following data value to encoded value relationships when the corresponding half clock cycle is high:

| Data Value | Code | Data Value | Code | Data Value | Code | Data Value | Code |
|---|---|---|---|---|---|---|---|
| 00000000 | 00101 00011 | 00100000 | 00110 10011 | 01000000 | 01001 10101 | 01100000 | 01011 10001 |
| 00000001 | 00101 00101 | 00100001 | 00110 10100 | 01000001 | 01001 10110 | 01100001 | 01011 10010 |
| 00000010 | 00101 00110 | 00100010 | 00110 10101 | 01000010 | 01001 11000 | 01100010 | 01011 10100 |
| 00000011 | 00101 00111 | 00100011 | 00110 10110 | 01000011 | 01001 11001 | 01100011 | 01011 11000 |
| 00000100 | 00101 01001 | 00100100 | 00110 11000 | 01000100 | 01001 11010 | 01100100 | 01100 00011 |
| 00000101 | 00101 01010 | 00100101 | 00110 11001 | 01000101 | 01001 11100 | 01100101 | 01100 00101 |
| 00000110 | 00101 01011 | 00100110 | 00110 11010 | 01000110 | 01010 00011 | 01100110 | 01100 00110 |
| 00000111 | 00101 01100 | 00100111 | 00110 11100 | 01000111 | 01010 00101 | 01100111 | 01100 00111 |
| 00001000 | 00101 01101 | 00101000 | 00111 00011 | 01001000 | 01010 00110 | 01101000 | 01100 01001 |
| 00001001 | 00101 01110 | 00101001 | 00111 00101 | 01001001 | 01010 00111 | 01101001 | 01100 01010 |
| 00001010 | 00101 10001 | 00101010 | 00111 00110 | 01001010 | 01010 01001 | 01101010 | 01100 01011 |
| 00001011 | 00101 10010 | 00101011 | 00111 01001 | 01001011 | 01010 01010 | 01101011 | 01100 01100 |
| 00001100 | 00101 10011 | 00101100 | 00111 01010 | 01001100 | 01010 01011 | 01101100 | 01100 01101 |
| 00001101 | 00101 10100 | 00101101 | 00111 01100 | 01001101 | 01010 01100 | 01101101 | 01100 01110 |
| 00001110 | 00101 10101 | 00101110 | 00111 10001 | 01001110 | 01010 01101 | 01101110 | 01100 10001 |
| 00001111 | 00101 10110 | 00101111 | 00111 10010 | 01001111 | 01010 01110 | 01101111 | 01100 10010 |
| 00010000 | 00101 11000 | 00110000 | 00111 10100 | 01010000 | 01010 10001 | 01110000 | 01100 10011 |
| 00010001 | 00101 11001 | 00110001 | 00111 11000 | 01010001 | 01010 10010 | 01110001 | 01100 10100 |
| 00010010 | 00101 11010 | 00110010 | 01001 00011 | 01010010 | 01010 10011 | 01110010 | 01100 10101 |
| 00010011 | 00101 11100 | 00110011 | 01001 00101 | 01010011 | 01010 10100 | 01110011 | 01100 10110 |
| 00010100 | 00110 00011 | 00110100 | 01001 00110 | 01010100 | 01010 10101 | 01110100 | 01100 11000 |
| 00010101 | 00110 00101 | 00110101 | 01001 00111 | 01010101 | 01010 10110 | 01110101 | 01100 11001 |
| 00010110 | 00110 00110 | 00110110 | 01001 01001 | 01010110 | 01010 11000 | 01110110 | 01100 11010 |
| 00010111 | 00110 00111 | 00110111 | 01001 01010 | 01011011 | 01010 11001 | 01110111 | 01100 11100 |
| 00011000 | 00110 01001 | 00111000 | 01001 01011 | 01011000 | 01010 11010 | 01111000 | 01101 00011 |
| 00011001 | 00110 01010 | 00111001 | 01001 01100 | 01011001 | 01010 11100 | 01111001 | 01101 00101 |
| 00011010 | 00110 01011 | 00111010 | 01001 01101 | 01011010 | 01011 00011 | 01111010 | 01101 00110 |
| 00011011 | 00110 01100 | 00111011 | 01001 01110 | 01011011 | 01011 00101 | 01111011 | 01101 01001 |
| 00001100 | 00110 01101 | 00111100 | 01001 10001 | 01001100 | 01011 00110 | 01101100 | 01101 01010 |
| 00011101 | 00110 01110 | 00111101 | 01001 10010 | 01011101 | 01011 01001 | 01111101 | 01101 01100 |
| 00011110 | 00110 10001 | 00111110 | 01001 10011 | 01011110 | 01011 01010 | 01111110 | 01101 10001 |
| 00011111 | 00110 10010 | 00111111 | 01001 10100 | 01011111 | 01011 01100 | 01111111 | 01101 10010 |
| 10000000 | 01101 10100 | 10100000 | 10010 00011 | 11000000 | 10100 00110 | 11100000 | 10110 01010 |
| 10000001 | 01101 11000 | 10100001 | 10010 00101 | 11000001 | 10100 00111 | 11100001 | 10110 01100 |
| 10000010 | 01110 00011 | 10100010 | 10010 00110 | 11000010 | 10100 01001 | 11100010 | 10110 10001 |
| 10000011 | 01110 00101 | 10100011 | 10010 00111 | 11000011 | 10100 01010 | 11100011 | 10110 10010 |
| 10000100 | 01110 00110 | 10100100 | 10010 01001 | 11000100 | 10100 01011 | 11100100 | 10110 10100 |
| 10000101 | 01110 01001 | 10100101 | 10010 01010 | 11000101 | 10100 01100 | 11100101 | 10110 11000 |
| 10000110 | 01110 01010 | 10100110 | 10010 01011 | 11000110 | 10100 01101 | 11100110 | 11000 00011 |
| 10000111 | 01110 01100 | 10100111 | 10010 01100 | 11000111 | 10100 01110 | 11100111 | 11000 00101 |
| 10001000 | 01110 10001 | 10101000 | 10010 01101 | 11001000 | 10100 10001 | 11101000 | 11000 00110 |
| 10001001 | 01110 10010 | 10101001 | 10010 01110 | 11001001 | 10100 10010 | 11101001 | 11000 00111 |
| 10001010 | 01110 10100 | 10101010 | 10010 10001 | 11001010 | 10100 10011 | 11101010 | 11000 01001 |
| 10001011 | 01110 11000 | 10101011 | 10010 10010 | 11001011 | 10100 10100 | 11101011 | 11000 01010 |
| 10001100 | 10001 00011 | 10101100 | 10010 10011 | 11001100 | 10100 10101 | 11101100 | 11000 01011 |
| 10001101 | 10001 00101 | 10101101 | 10010 10100 | 11001101 | 10100 10110 | 11101101 | 11000 01100 |
| 10001110 | 10001 00110 | 10101110 | 10010 10101 | 11001110 | 10100 11000 | 11101110 | 11000 01101 |
| 10001111 | 10001 00111 | 10101111 | 10010 10110 | 11001111 | 10100 11001 | 11101111 | 11000 01110 |
| 10010000 | 10001 01001 | 10110000 | 10010 11000 | 11010000 | 10100 11010 | 11110000 | 11000 10001 |
| 10010001 | 10001 01010 | 10110001 | 10010 11001 | 11010001 | 10100 11100 | 11110001 | 11000 10010 |
| 10010010 | 10001 01011 | 10110010 | 10010 11010 | 11010010 | 10101 00011 | 11110010 | 11000 10011 |
| 10010011 | 10001 01100 | 10110011 | 10010 11100 | 11010011 | 10101 00101 | 11110011 | 11000 10100 |
| 10010100 | 10001 01101 | 10110100 | 10011 00011 | 11010100 | 10101 00110 | 11110100 | 11000 01010 |
| 10010101 | 10001 01110 | 10110101 | 10011 00101 | 11010101 | 10101 01001 | 11110101 | 11000 10110 |
| 10010110 | 10001 10001 | 10110110 | 10011 00110 | 11010110 | 10101 01010 | 11110110 | 11000 11000 |
| 10010111 | 10001 10010 | 10110111 | 10011 01001 | 11010111 | 10101 01100 | 11110111 | 11000 11001 |
| 10011000 | 10001 10011 | 10111000 | 10011 01010 | 11011000 | 10101 10001 | 11111000 | 11000 11010 |
| 10011001 | 10001 10100 | 10111001 | 10011 01100 | 11011001 | 10101 10010 | 11111001 | 11000 11100 |

-continued

| Data Value | Code | Data Value | Code | Data Value | Code | Data Value | Code |
|---|---|---|---|---|---|---|---|
| 10011010 | 10001 10101 | 10111010 | 10011 10001 | 11011010 | 10101 10100 | 11111010 | 11001 00011 |
| 10011011 | 10001 10110 | 10111011 | 10011 10010 | 11011011 | 10101 11000 | 11111011 | 11001 00101 |
| 10001100 | 10001 11000 | 10111100 | 10011 10100 | 11001100 | 10110 00011 | 11101100 | 11001 00110 |
| 10011101 | 10001 11001 | 10111101 | 10011 11000 | 11011101 | 10110 00101 | 11111101 | 11001 01001 |
| 10011110 | 10001 11010 | 10111110 | 10100 00011 | 11011110 | 10110 00110 | 11111110 | 11001 01010 |
| 10011111 | 10001 11100 | 10111111 | 10100 00101 | 11011111 | 10110 01001 | 11111111 | 11001 01100 | and the encoded values have complementary bit values when the corresponding half clock cycle is low.

31. The method of claim 27, wherein:

the data values and corresponding encoded values are monotonic with respect to one another.

32. The method of claim 27, further including:

converting between data values and encoded values when a control indicator has one value, and between control code values and encoded values when the control indicator has another value, the control code values being different than the data values.

33. The method of claim 32, wherein:

the encoded values include stress codes, an absolute DC component of each stress code when summed with the value of the corresponding half clock cycle being greater than one.

34. The method of claim 27, wherein:

converting between data values and encoded values includes decoding encoded values into data values, the decoding data values includes storing first portions of data values; and accessing first portions of data values with first portions of the encoded values.

35. The method of claim 34, wherein:

decoding data values further includes storing second portions of data values;

accessing stored second portions of data values with at least second portions of the encoded values.

36. The method of claim 35, wherein:

decoding data values further includes storing type values corresponding to first portions of the encoded values;

accessing stored type values with the first portions of the encoded values;

accessing stored second portions of data values with the second portions of the encoded values and the type values.

\* \* \* \* \*